(12) United States Patent
Ohguro

(10) Patent No.: US 7,582,940 B2
(45) Date of Patent: Sep. 1, 2009

(54) SEMICONDUCTOR DEVICE USING MEMS TECHNOLOGY

(75) Inventor: Tatsuya Ohguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 425 days.

(21) Appl. No.: 11/341,910

(22) Filed: Jan. 30, 2006

(65) Prior Publication Data

US 2006/0267109 A1 Nov. 30, 2006

(30) Foreign Application Priority Data

May 30, 2005 (JP) .............................. 2005-157523

(51) Int. Cl.
*H01L 27/20* (2006.01)
*H01L 41/08* (2006.01)

(52) U.S. Cl. ................ 257/415; 257/417; 257/E27.006

(58) Field of Classification Search ................ 257/415, 257/417, E27.006
See application file for complete search history.

(56) References Cited

U.S. PATENT DOCUMENTS 6,355,498 B1 3/2002 Chan et al.
6,359,374 B1 3/2002 Dausch et al.
6,586,295 B2 7/2003 Ohno
6,608,377 B2 8/2003 Chang et al.
6,690,081 B2 2/2004 Bakir et al.
2001/0004085 A1* 6/2001 Gueissaz .................. 228/124.6
2004/0053434 A1* 3/2004 Bruner ......................... 438/52
2004/0126953 A1* 7/2004 Cheung ....................... 438/200
2004/0262645 A1* 12/2004 Huff et al. .................... 257/232
2006/0108675 A1* 5/2006 Colgan et al. ................ 257/684

FOREIGN PATENT DOCUMENTS

JP 2003-117897 A 4/2003

* cited by examiner

*Primary Examiner*—David Vu
*Assistant Examiner*—Earl N Taylor
(74) *Attorney, Agent, or Firm*—Foley & Lardner LLP

(57) ABSTRACT

A semiconductor device using a MEMS technology according to an example of the present invention comprises a cavity, a lower electrode positioned below the cavity, a moving part positioned in the cavity, an upper electrode coupled with the moving part, a film which covers an upper part of the cavity and has an opening, and a material which closes the opening and seals the cavity.

20 Claims, 24 Drawing Sheets

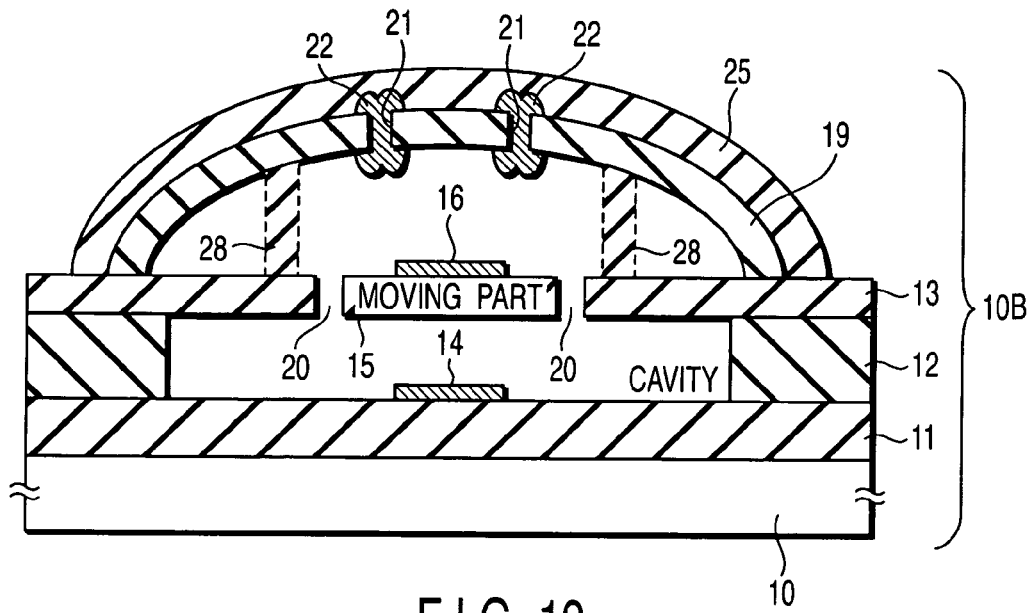
F I G. 19
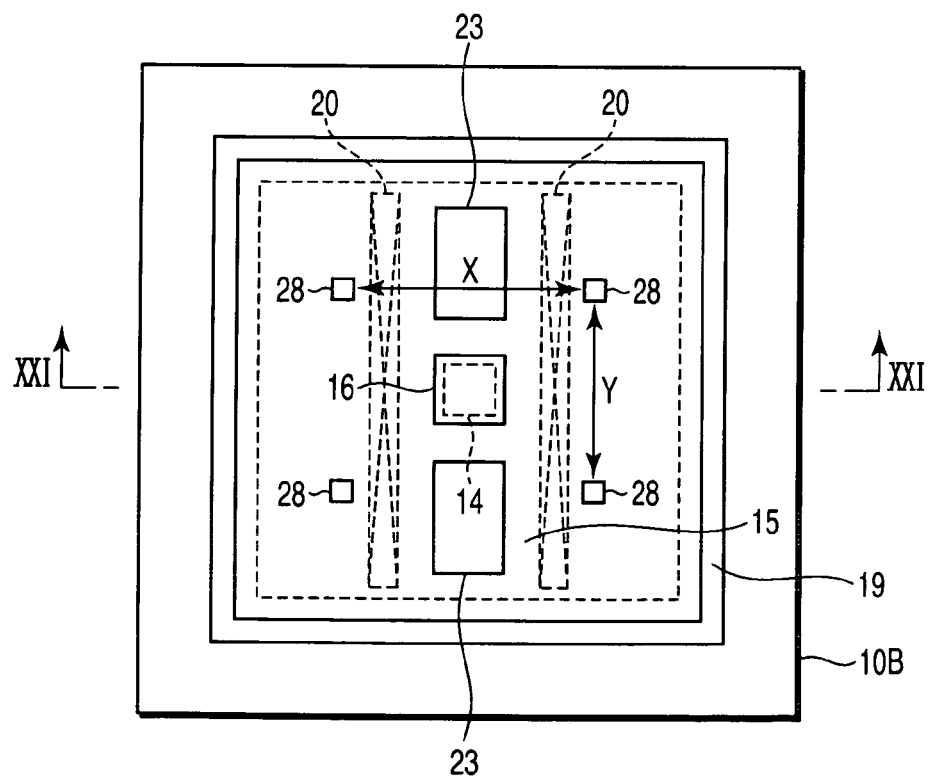
F I G. 20

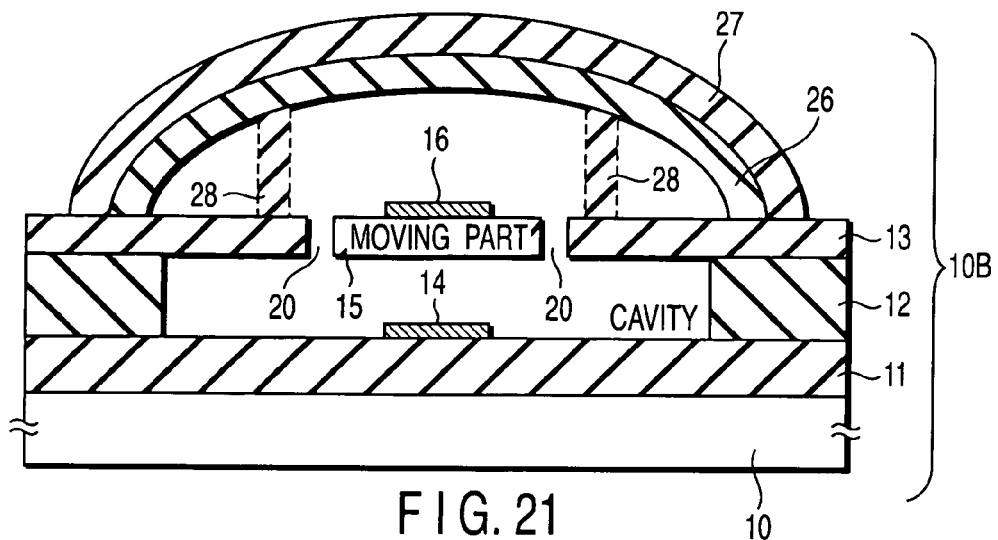
F I G. 21
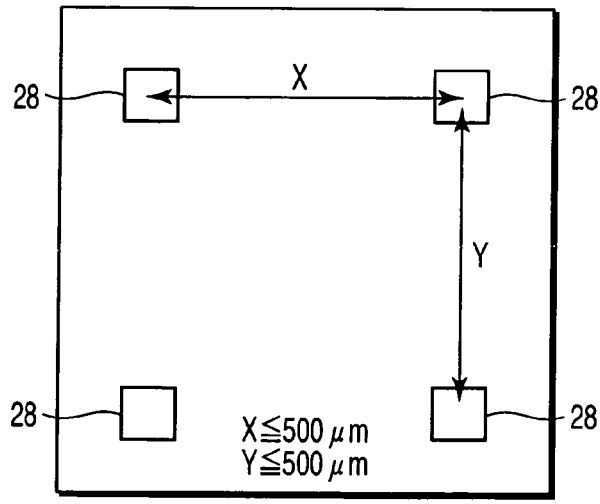
F I G. 22
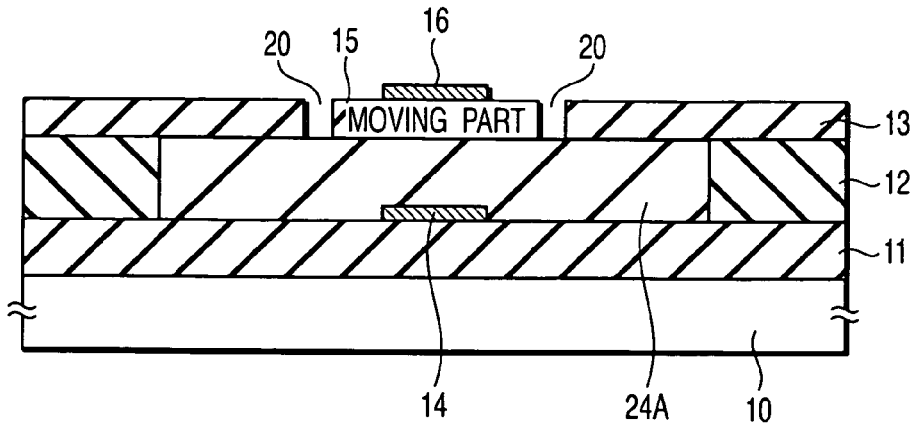
F I G. 23

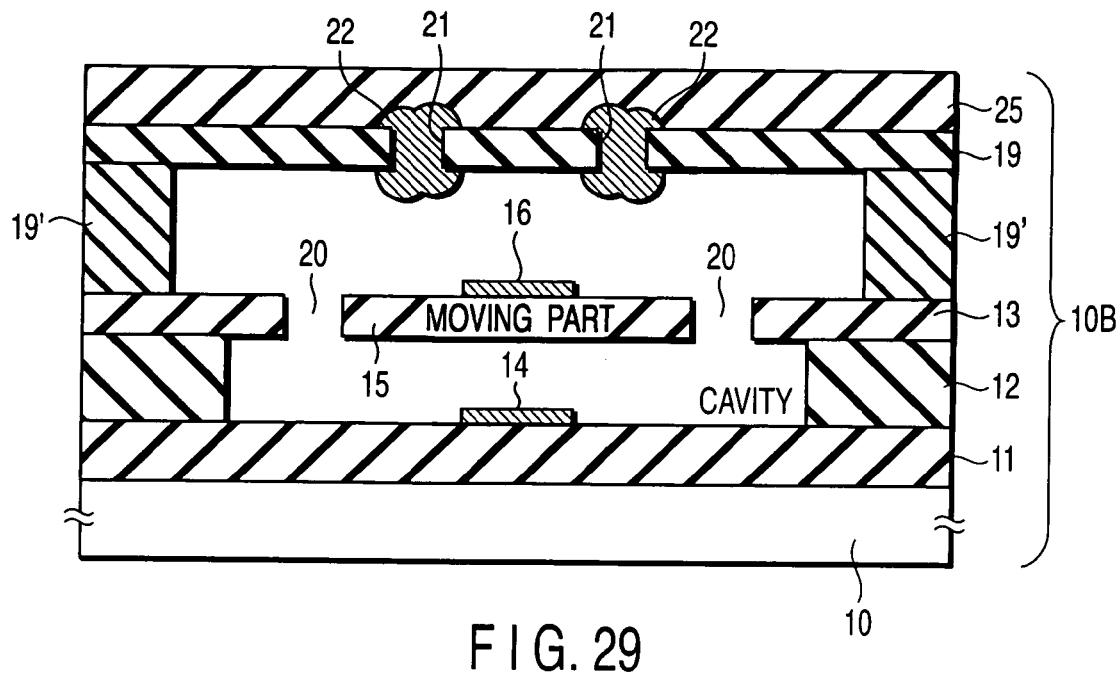
F I G. 29
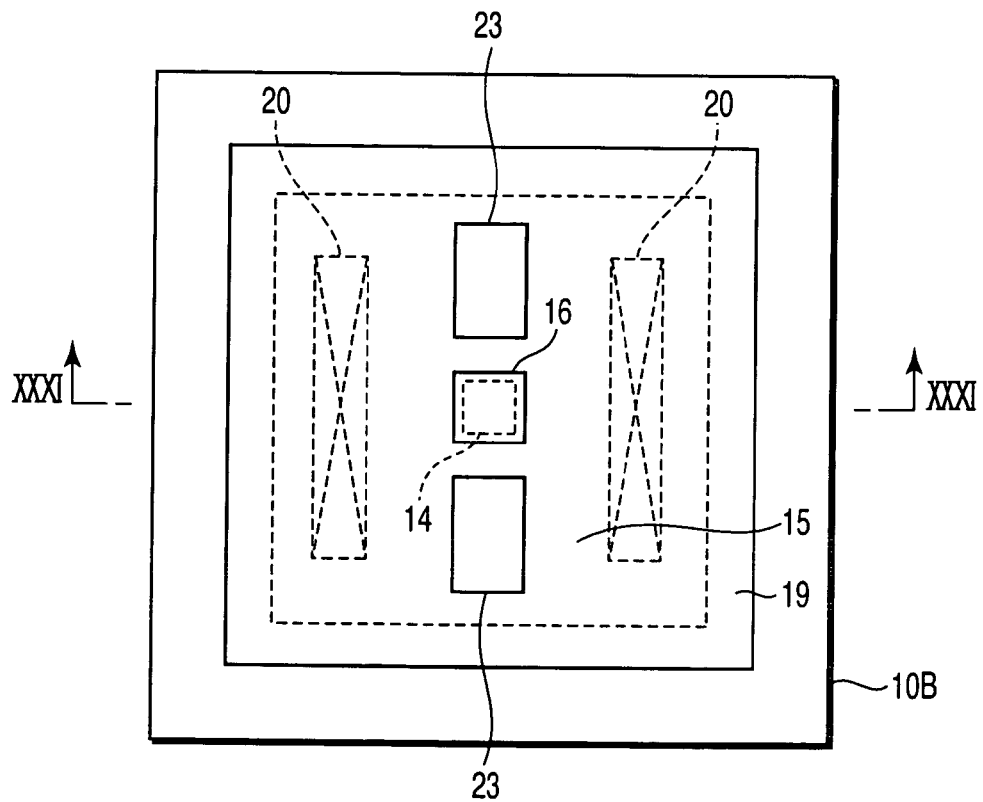
F I G. 30

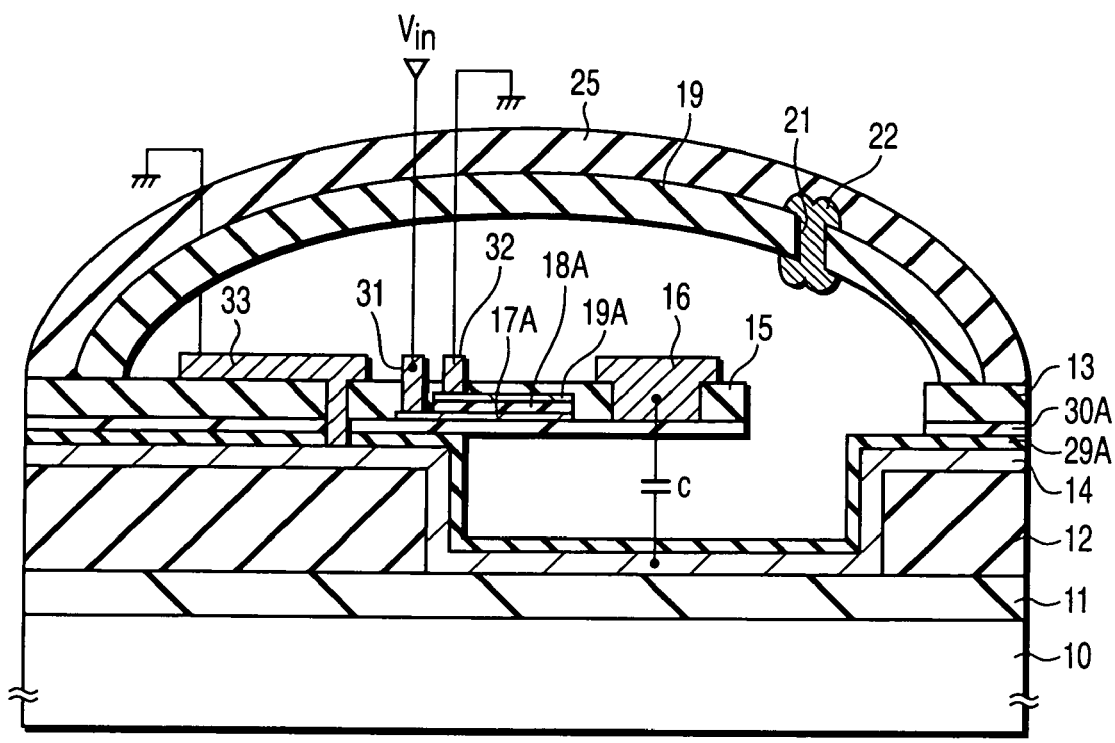
F I G. 60
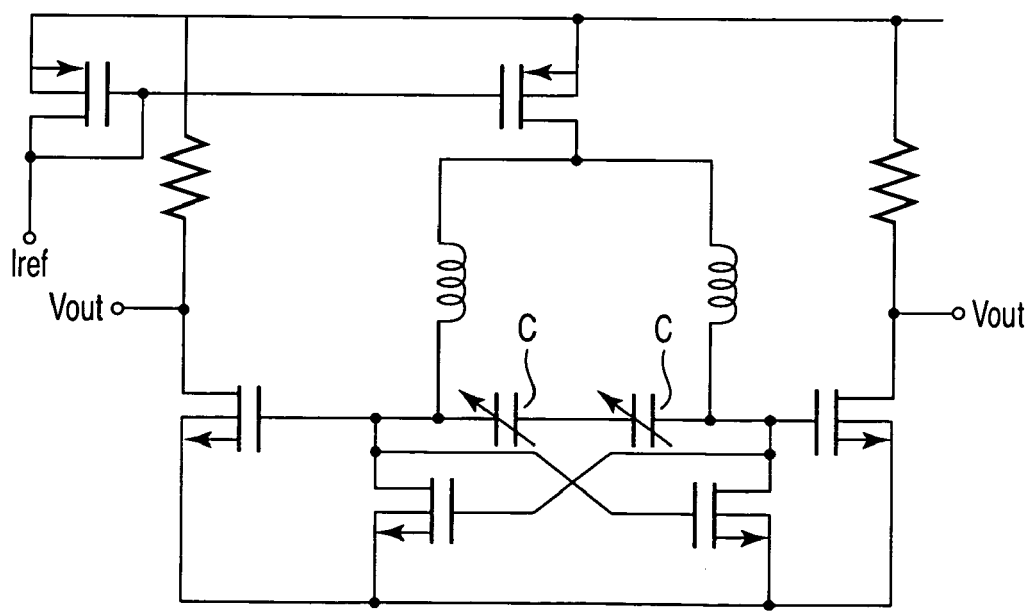
F I G. 61

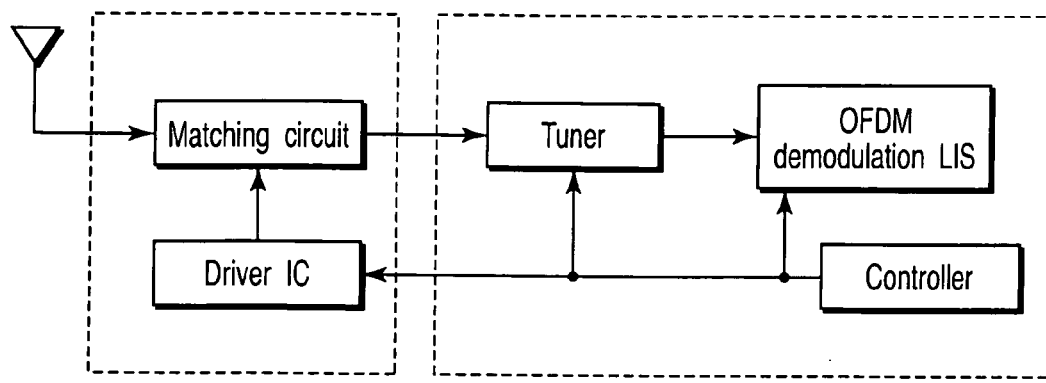
F I G. 62
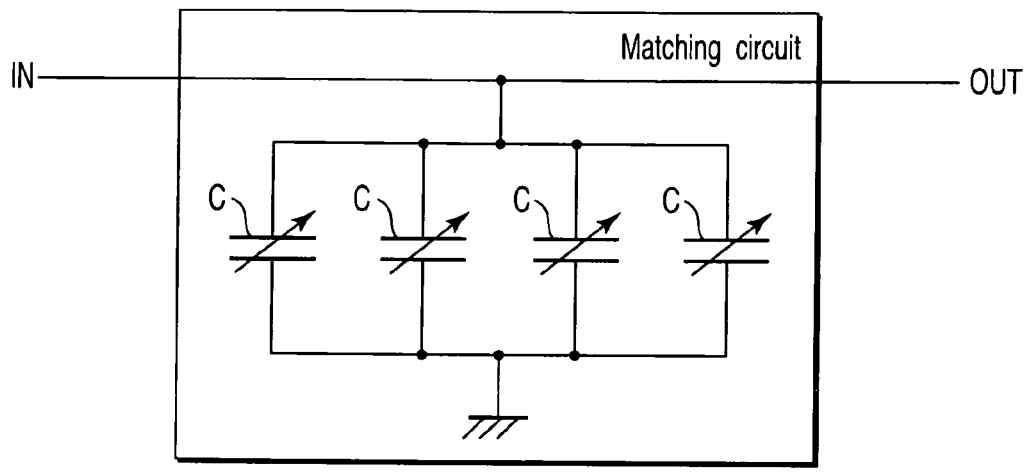
F I G. 63
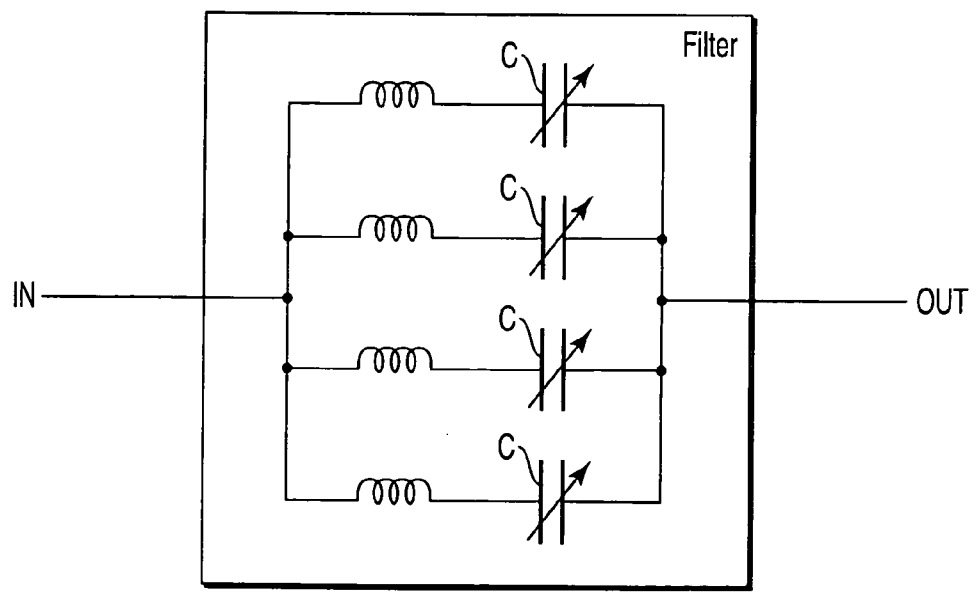
F I G. 64

# SEMICONDUCTOR DEVICE USING MEMS TECHNOLOGY

CROSS-REFERENCE TO RELATED APPLICATIONS

This application is based upon and claims the benefit of priority from prior Japanese Patent Application No. 2005-157523, filed May 30, 2005, the entire contents of which are incorporated herein by reference.

BACKGROUND OF THE INVENTION

1. Field of the Invention

The present invention relates to a semiconductor device using a MEMS (micro electro mechanical systems) technology (which will be referred to as a MEMS component hereinafter).

2. Description of the Related Art

The MEMS technology is a technology which finely manufactures a movable three-dimensional structure (moving part) by applying a semiconductor processing technique.

According to the MEMS technology, there is the possibility of developing a small high-performance component which is beyond comparison with existing components. For example, dramatically reducing a packaging dimension and greatly decreasing a power consumption by realizing integration of, e.g., an LSI and an individual component are no dream.

At present, as the MEMS components, a variable capacity, a switch, an acceleration sensor, a pressure sensor, an RF (radio frequency) filter, a gyroscope, a mirror device and others are mainly studied and developed (e.g., U.S. Pat. No. 6,355,498, U.S. Pat. No. 6,359,374, Jpn. Pat. Appln. KOKAI No. 2003-117897).

When translating these components into practical applications, however, there are still many problems which must be solved in terms of the reliability, a process yield, a manufacturing cost and others.

In relation to the reliability and a process yield, there is a problem of the strength of the MEMS component. For example, when water ($H_2O$) enters a cavity which serves as a movable area of a moving part at the time of dicing, the MEMS component may be destroyed by a pressure of water in some cases. Therefore, in order to put the MEMS component to practical use, a technique which protects the MEMS component from such immersion of water and improves the reliability and a process yield must be developed.

In regard to a manufacturing cost, the development of a process technique which can realize the high reliability and a high process yield while decreasing the number of steps is a key point. However, when a so-called wafer level packaging technique which seals a cavity by attaching two wafers is adopted in order to protect the MEMS component from the above-described immersion of water, there is a problem in which the production steps become complicated, a manufacturing cost is increased and a chip size becomes large.

BRIEF SUMMARY OF THE INVENTION

A semiconductor device using a MEMS technology according to an aspect of the present invention comprises: a cavity; a lower electrode positioned below the cavity; a moving part positioned in the cavity; an upper electrode coupled with the moving part; a film which covers the upper portion of the cavity and has an opening; and a material which closes the opening and seals the cavity.

A semiconductor device using a MEMS technology according to an aspect of the present invention comprises: a cavity; a lower electrode positioned below the cavity; a moving part positioned in the cavity; an upper electrode coupled with the moving part; and a film which covers the upper portion of the cavity and is formed of a porous material.

BRIEF DESCRIPTION OF THE SEVERAL VIEWS OF THE DRAWING

FIG. 19 is a cross-sectional view taken along a line XIX-XIX in FIG. 18;

FIG. 20 is a plan view showing a MEMS component according to the third embodiment;

FIG. 21 is a cross-sectional view taken along a line XXI-XXI in FIG. 20;

FIG. 22 is a plan view showing pitches of columns used in the MEMS component depicted in FIGS. 18 to 21;

FIG. 23 is a cross-sectional view showing a step in a manufacturing method of the MEMS component depicted in FIGS. 20 and 21;

FIG. 29 is a cross-sectional view taken along a line XXIX-XXIX in FIG. 28;

FIG. 30 is a plan view showing a MEMS component concerning a modification of the second embodiment;

FIG. 60 is a cross-sectional view showing a step in the method of manufacturing the variable capacity depicted in FIGS. 53 and 54;

FIG. 61 is a circuit diagram showing an example of a VCO;

FIG. 62 is a block diagram showing an example of a transmitter/receiver;

FIG. 63 is a circuit diagram showing an example of a matching circuit; and

FIG. 64 is a circuit diagram showing an example of a filter.

DETAILED DESCRIPTION OF THE INVENTION

A semiconductor device using a MEMS technology of an aspect of the present invention will be described below in detail with reference to the accompanying drawings.

1. GENERAL OUTLINE

An example of the present invention is applied to general MEMS components, e.g., a variable capacity, a switch, an accelerator sensor, a pressure sensor, an RF (radio frequency) filter, a gyroscope, a mirror device and others.

The example of the present invention proposes a technology which protects a MEMS component from immersion of water irrespective of wafer level packaging in order to simultaneously realize the high reliability, a high process yield and a decrease in a manufacturing cost based on a reduction in the number of production steps.

In order to realize this, at first, a cavity is covered with a film formed of a material such as an insulator, a conductor or a semiconductor rather than a wafer. Although an opening is provided to this film, this opening is closed by a material such as an insulator, a conductor or a semiconductor.

At second, an upper portion of the cavity is covered with a film (a porous film) formed of a porous material. In this case, the sealed cavity can be formed without providing an opening.

With such a configuration, it is possible to realize a MEMS component which can reduce a manufacturing cost with the high reliability and a high process yield.

Here, in the example of the present invention, there is a problem of characteristic fluctuations caused by bending of the MEMS component due to existence of the cavity which serves as a movable area of a moving part. Therefore, columns which reinforce the configuration inside the cavity and suppress bending of the MEMS component may be arranged in the cavity.

It is to be noted that the example of the present invention is not restricted to a type of an actuator which allows movement of the moving part. For example, as the actuator, it is possible to use a piezoelectric type using a piezoelectric force, an electrostatic type utilizing an electrostatic force, a heat type utilizing deformation due to heat, an electromagnetic type using an electromagnetic force.

2. REFERENCE EXAMPLE

First, a MEMS component as a reference example which is a presupposition of the example according to the present invention and its problems will be described.

Figure 1:
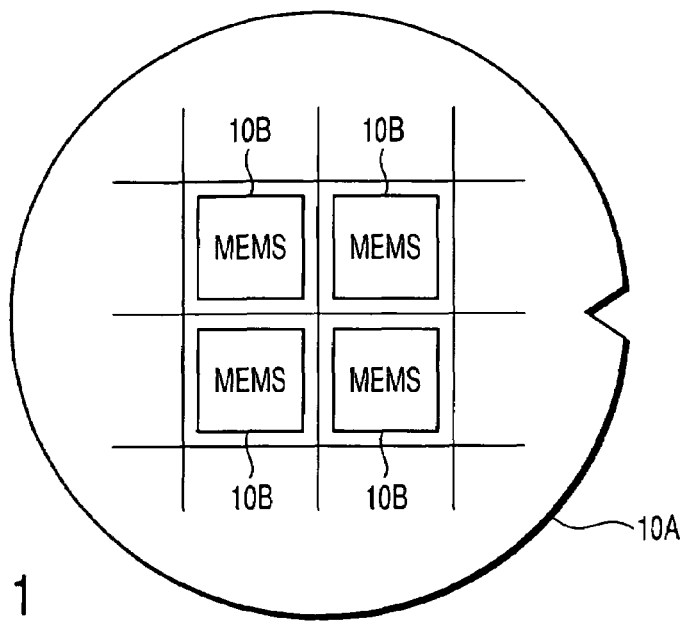
FIG. 1 is a plan view showing a plurality of MEMS components on a wafer.
Figure 2:
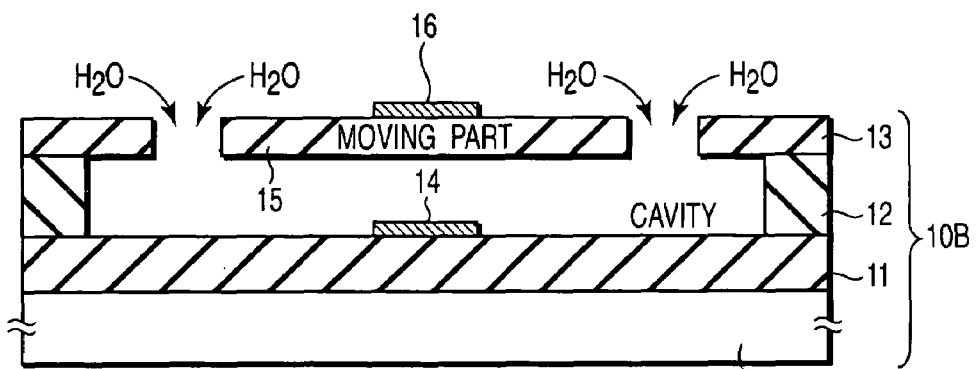
FIG. 2 is a cross-sectional view showing a MEMS component as a reference example.

As shown in FIG. 1, a plurality of MEMS components 10B are formed on a wafer 10A. Each of the plurality of MEMS components has a configuration shown in, e.g., FIG. 2.

An insulating layer 11 is arranged on a semiconductor substrate 10. An insulating layer 12 is arranged on the insulating layer 11. The insulating layer 12 has a groove. This groove is covered with insulating layers 13 and 15 to serve as a cavity.

Openings are provided above the cavity, and the insulating layer 15 functions as a moving part. In this example, since a type of the actuator which allows movement of the moving part is not important, the actuator is eliminated.

A lower electrode 14 is arranged on the insulating layer 11 at the bottom portion of the groove, and an upper electrode 16 is arranged on the insulating layer 15 as the moving part.

A problem of such a MEMS component lies in that water ($H_2O$) enters the cavity serving as a movable area of the moving part to destroy the moving part at the time of dicing by which the plurality of MEMS components 10B on the wafer 10A are separated from each other.

Thus, although protecting the MEMS component from immersion of water at the time of dicing is required, a technique called wafer level packaging has been therefore adopted in a prior art.

Figure 3:
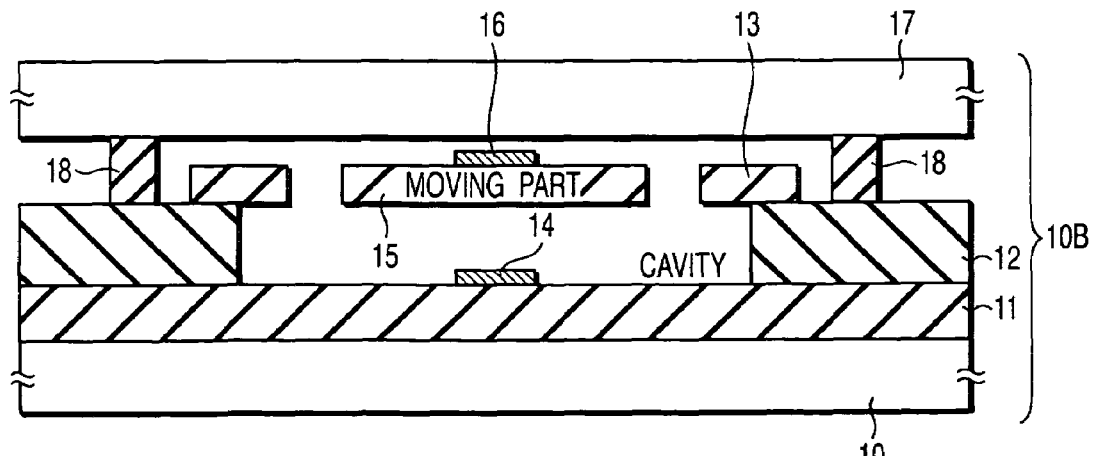
FIG. 3 is a cross-sectional view showing a MEMS component as a reference example.

In the wafer level packaging, for example, as shown in FIG. 3, a semiconductor substrate (a wafer) 17 having an insulating layer 18 as a frame surrounding the moving part is attached to the semiconductor substrate (a wafer) 10.

As a result, a sealed cavity is formed, but the wafer level packaging is expensive, and there is a problem in which forming a completely sealed cavity is difficult due to warpage or the like of the wafer. Further, problems such as an increase in a chip size, a parasitic resistance of a signal line, a parasitic capacitance and others must be also solved.

3. EMBODIMENTS

Some of embodiments which seem to be the best will now be described.

(1) First Embodiment a. Configuration

Figure 4:
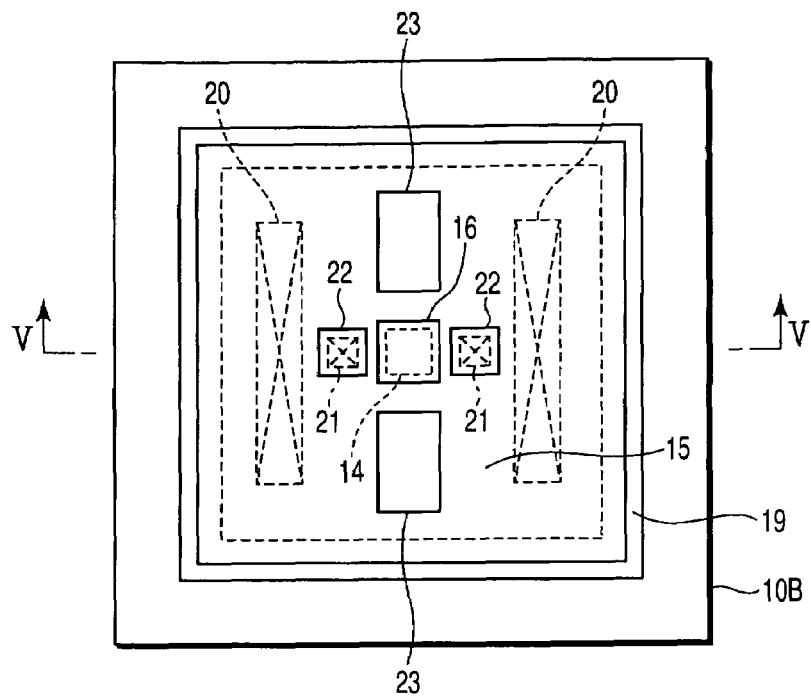
FIG. 4 is a plan view showing a MEMS component according to a first embodiment.
Figure 5:
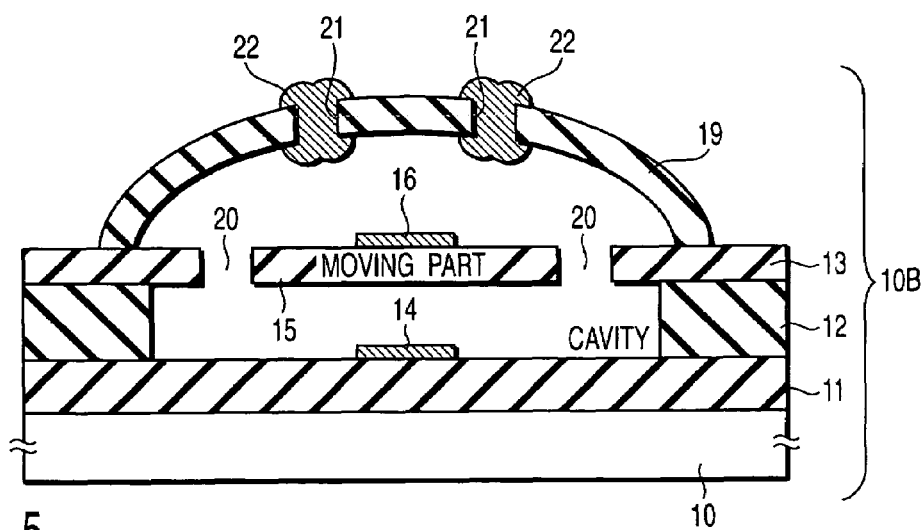
FIG. 5 is a cross-sectional view taken along a line V-V in FIG. 4.

FIG. 4 shows a MEMS component according to a first embodiment. FIG. 5 is a cross-sectional view taken along a line V-V in FIG. 4.

An insulating layer 11 is arranged on a semiconductor substrate 10. An insulating layer 12 is arranged on the insulating layer 11. The insulating layer 12 has a groove. This groove is covered with the insulating layers 13 and 15. The insulating layers 13 and 15 have openings 20.

The insulating layer 15 functions as a moving part.

An actuator 23 which allows movement of the insulating layer 15 is coupled on the insulating layer 15. Although the actuator 13 is briefly described in this example, a piezoelectric element is formed on the insulating layer 15 if the actuator 23 is of a piezoelectric type.

A lower electrode 14 is arranged on the insulating layer 11 at a bottom portion of the groove, and an upper electrode 16 is arranged on the insulating layer 15 which is the moving part.

A film 19 formed of an insulator is arranged above the insulating layer 15 as the moving part. The film 19 formed of the insulator has openings 21, but each of these openings 21 is closed by a material 22 such as an insulator, a conductor or a semiconductor. The film 19 formed of the insulator forms a cavity around the moving portion.

According to such a configuration, since the film 19 constituted of the insulator forms the cavity, the MEMS component having a low cost, the high reliability and a high production yield can be provided.

Here, the surface of the film 19 constituted of the insulator is a curved surface in this example. When the surface of the film 19 constituted of the insulator is a curved surface in this manner, an improvement in strength of this film 19 and a reduction in the number of production steps can be realized.

Further, as seen from above the cavity, a position of each opening 21 provided to the film 19 constituted of the insulator does not overlap a position of each opening 20 provided to the insulating layers 13 and 15. The main purport of this positional relationship is preventing the material 22 closing the opening 21 from adversely affecting the operation of the moving part.

That is, when the openings 20 and 21 overlap each other, a part of the material 22 closing the opening 21 is deposited on the lower portion of the cavity (the bottom portion of the groove of the insulating layer 12), which may adversely affect the operation of the moving part. This can be avoided by preventing the openings 20 and 21 from overlapping each other.

It is preferable for the openings 20 and 21 to be 0.3 μm or more away from each other.

Incidentally, in regard to the film 19 constituted of the insulator, this film 19 can be constituted of a conductor or a semiconductor in place of the insulator.

b. Material, Size and Others

Examples of a material, a size and others used for the MEMS component depicted in FIGS. 4 and 5 will now be described.

The semiconductor substrate 10 can be selected from, e.g., an intrinsic semiconductor such as Si, Ge or the like, a compound semiconductor such as GaAs, ZnSe or the like, and a highly electroconductive semiconductor obtained by doping impurities in the former semiconductors. The semiconductor substrate 10 may be an SOI (silicon on insulator) substrate.

The insulating layers 11 and 12 are constituted of, e.g., silicon oxide. A thickness of the insulating layer 12 determines a movable range of the moving part. A thickness of the insulating layer 12 is set to 3 nm or above, or preferably 400 nm or above.

The lower electrode 14 and the upper electrode 16 can be selected from, e.g., a metal such as W, Al, Cu, Au, Ti, Pt or the like, an alloy containing at least one of these metals, electroconductive polysilicon containing impurities and others. The lower electrode 14 and the upper electrode 16 may have a single-layer configuration or a laminated layer configuration.

In case of using electroconductive polysilicon containing impurities as the lower electrode 14 and the upper electrode 16, it is preferable to form silicide on electroconductive polysilicon in order to realize a low resistance. Furthermore, the lower electrode 14 and the upper electrode 16 may contain an element such as Co, Ni, Si or N.

The lower electrode 14 and the upper electrode 16 may be constituted of the same configuration or the same material, or may be constituted of different configurations or different materials.

A planar shape of each of the lower electrode 14 and the lower electrode 16 is not restricted in particular. For example, it is possible to adopt a square shape, a rectangular shape, a circular shape, a polygonal shape and others.

The insulating layers 13 and 15 and the film 19 constituted of the insulator are formed of, e.g., silicon oxide. As the material 22 closing the opening 21, for example, SiGe can be used.

A planar shape of the film 19 constituted of the insulator may be a square shape, a rectangular shape or any other shape such as a circular shape, an elliptic shape or a polygonal shape. When the planar shape of the film 19 constituted of the insulator is a circular shape, the film 19 has a dome-like shape.

In regard to a size of the MEMS component (one chip), in case of, e.g., a discrete product in which the MEMS component alone is formed in the chip, the MEMS component has a square shape whose size is approximately 2 cm×2 cm or smaller.

An air pressure in the cavity and a gas filled in the cavity are not restricted in particular. For example, an air pressure in the cavity may be an atmospheric pressure or may be in a state close to a vacuum. Moreover, a gas filled in the cavity may mainly have carbon dioxide or may have the same components as those of atmospheric air.

As a planar shape of the cavity, it is possible to adopt, e.g., a square shape, a rectangular shape, a circular shape, a polygonal shape or the like.

c. Manufacturing Method

A manufacturing method of the MEMS component depicted in FIGS. 4 and 5 will now be described.

Figure 6:
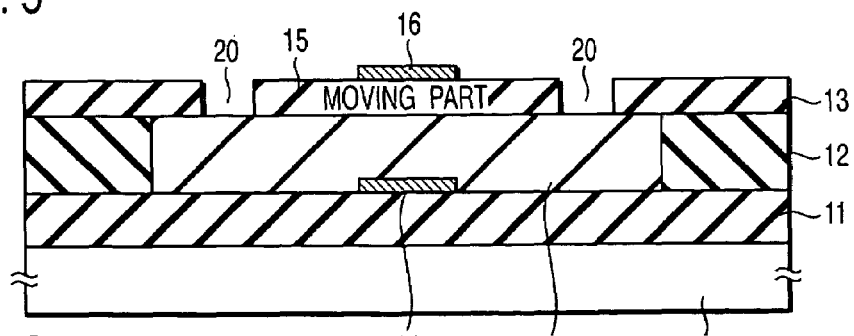
FIG. 6 is a cross-sectional view showing a step in a manufacturing method of the MEMS component depicted in FIGS. 4 and 5.

First, as shown in FIG. 6, an insulating layer (e.g., silicon oxide) 11 having a thickness of approximately 1.3 μm is formed on a semiconductor substrate 10 by using a thermal oxidation method. Additionally, an insulating layer (e.g., silicon oxide) 12 having a thickness of approximately 1 μm is formed on the insulating layer 11 by using a CVD (chemical vapor deposition) method.

Then, a groove is formed to the insulating layer 12 by a PEP (photo engraving process). For example, a resist pattern is formed on the insulating layer 12, and the insulating layer 12 is etched by RIE (reactive ion etching) with this resist pattern being used as a mask, thereby forming the groove to the insulating layer 12. Thereafter, the resist pattern is removed.

Further, an electroconductive layer 14 is formed on the insulating layers 11 and 12, and the electroconductive layer 14 is patterned by the PEP, thereby obtaining a lower electrode. When forming the MEMS component as a variable capacity, an insulating layer (e.g., silicon nitride) which covers the lower electrode 14 is then formed by the CVD method.

Subsequently, a dummy layer 24A which completely fills the groove formed to the insulating layer 12 is formed. As the dummy layer 24A, it is possible to use one selected from a group consisting of a silicon material such as polysilicon or amorphous silicon, an insulating material such as $SiO_2$ or SiN, a metal material such as Ti, TiN, Al, Cu, Ni, Co, Au or the like, an organic material such as polyimide, carbon, resist or the like, and a so-called low-k material having a low dielectric constant.

In case of using an organic material as the dummy layer 24A, applying the dummy layer 24A filling the groove of the insulating layer 12 can suffice, for example.

In case of using a silicon material, an insulating material, a metal material or a low-k material as the dummy layer 24A, the dummy layer 24A which completely fills the groove of the insulating layer 12 is formed on the insulating layer 12 by using, e.g., the CVD method or a sputtering method, and then the dummy layer 24A is etched by CMP (chemical mechanical polishing) or etching back so that the dummy layer 24A alone remains in the groove.

Here, when performing CMP or etching back, conditions of CMP or etching back and materials of the insulating layer 12 and the dummy layer 24A are selected in such a manner that an etching selection ratio of the insulating layer 12 and the dummy layer 24A becomes large.

Furthermore, an etching stopper having an etching selection ratio with respect to the dummy layer 24A may be formed on the insulating layer 12 in advance before performing CMP or etching back.

Then, insulating layers (e.g., silicon oxide) 13 and 15 having a thickness of approximately 100 nm are formed on the insulating layer 12 and the dummy layer 24A by using the CVD method. Here, since the surface of the dummy layer 24A is flattened, the surfaces of the insulating layers 13 and 15 are also flat.

Moreover, openings 20 are formed to the insulating layers 13 and 15 by using the PEP, and an actuator comprising, e.g., a piezoelectric element is formed on the insulating layer 15.

Additionally, an electroconductive layer 16 is formed on the insulating layer 15, and the electroconductive layer 16 is patterned by the PEP, thereby obtaining an upper electrode.

Thereafter, although the dummy layer 24 can be removed by using a chemical, a reactive gas or the like, the dummy layer 24A is left as it is in order to reduce the number of production steps in this example.

Figure 7:
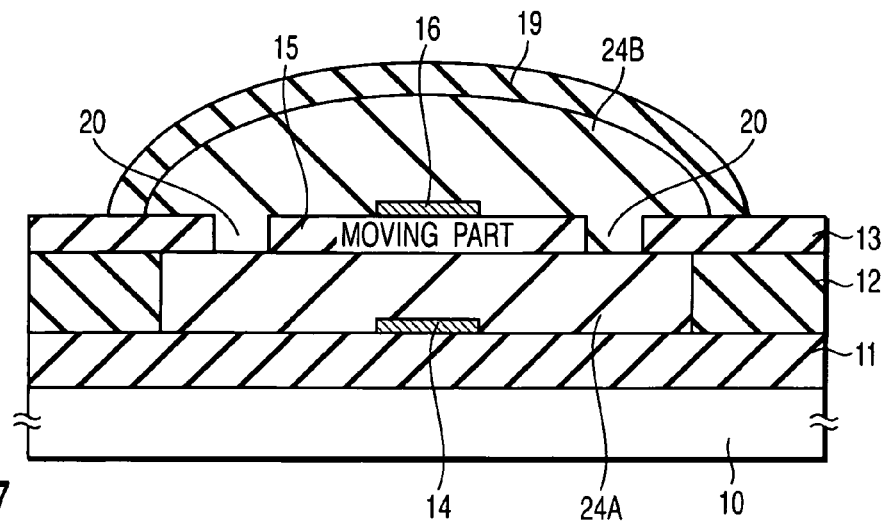
FIG. 7 is a cross-sectional view showing a step in the manufacturing method of the MEMS component depicted in FIGS. 4 and 5.

Then, as shown in FIG. 7, a dummy layer 24B which covers the insulating layer 15 is formed. In cases where the dummy layer 24A is not removed at the step shown in FIG. 6, it is preferable for the dummy layer 24B to be formed of the same material as that of the dummy layer 24A or a material which can be removed by using the same etchant as that of the dummy layer 24A.

In cases where the dummy layer 24A is removed at the step shown in FIG. 6, the dummy layer 24B is also filled in the groove of the insulating layer 12 in place of the dummy layer 24A.

As the dummy layer 24B, it is possible to use one selected from a group consisting of a silicon material such as polysilicon or amorphous silicon, an insulating material such as $SiO_2$ or SiN, a metal material such as Ti, TiN, Al, Cu, Ni, Co or Au, an organic material such as polyimide, carbon or resist and a so-called low-k material having a low dielectric constant like the dummy layer 24A.

A cross-sectional shape and a planar shape of the dummy layer 24B are square when the dummy layer 24B is processed into a shape which covers the insulating layer 15.

In this example, the dummy layer 24B is then fluidized by performing, e.g., annealing so that the dummy layer 24B has a curved surface by the surface tension. At this time, the dummy layer 24B may still have the square planar shape or may have a circular or elliptic planar shape.

Then, a film (e.g., silicon oxide) 19 constituted of an insulator is formed on the dummy layer 24B. In regard to the film 19 constituted of the insulator, this film 19 can be constituted of a conductor or a semiconductor in place of the insulator.

Figure 8:
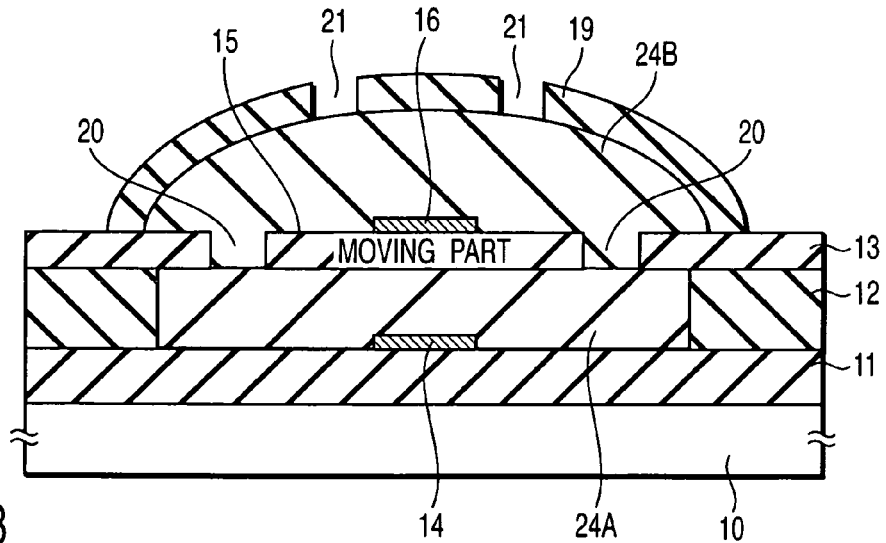
FIG. 8 is a cross-sectional view showing a step in the manufacturing method of the MEMS component depicted in FIGS. 4 and 5.

Subsequently, as shown in FIG. 8, openings 21 are formed to the film 19 constituted of the insulator by using the PEP. The number of the openings 21 may be a singular number or a plural number. Further, each opening 21 is provided at a position which does not overlap the opening 20 while considering the step of closing the opening 21 which will be performed later.

Figure 9:
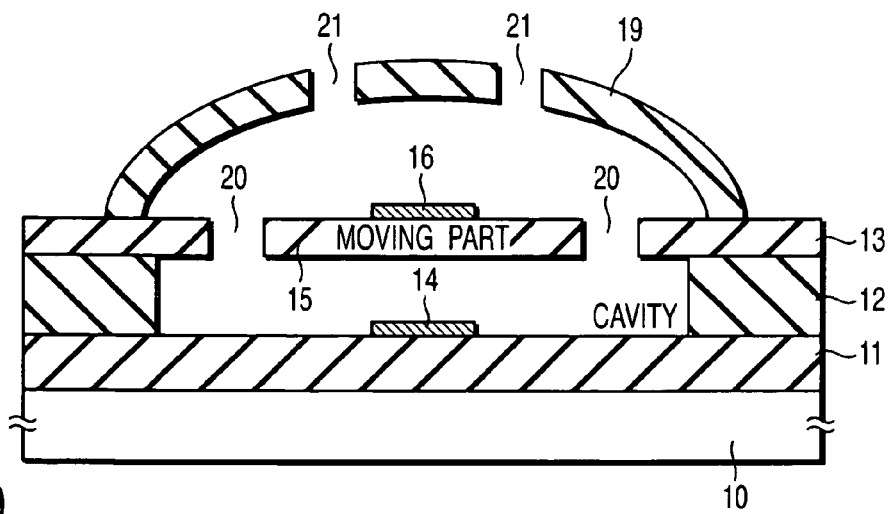
FIG. 9 is a cross-sectional view showing a step in the manufacturing method of the MEMS component depicted in FIGS. 4 and 5.

Thereafter, when the dummy layers 24A and 24B are removed by using a chemical, a reactive gas or the like, a cavity is formed around the insulating layer 15 as the moving part as shown in FIG. 9.

It is to be noted that, when the dummy layers 24B and 24B are formed of resist, the dummy layers 24A and 24B can be removed by a vaporizing method called ashing.

Figure 10:
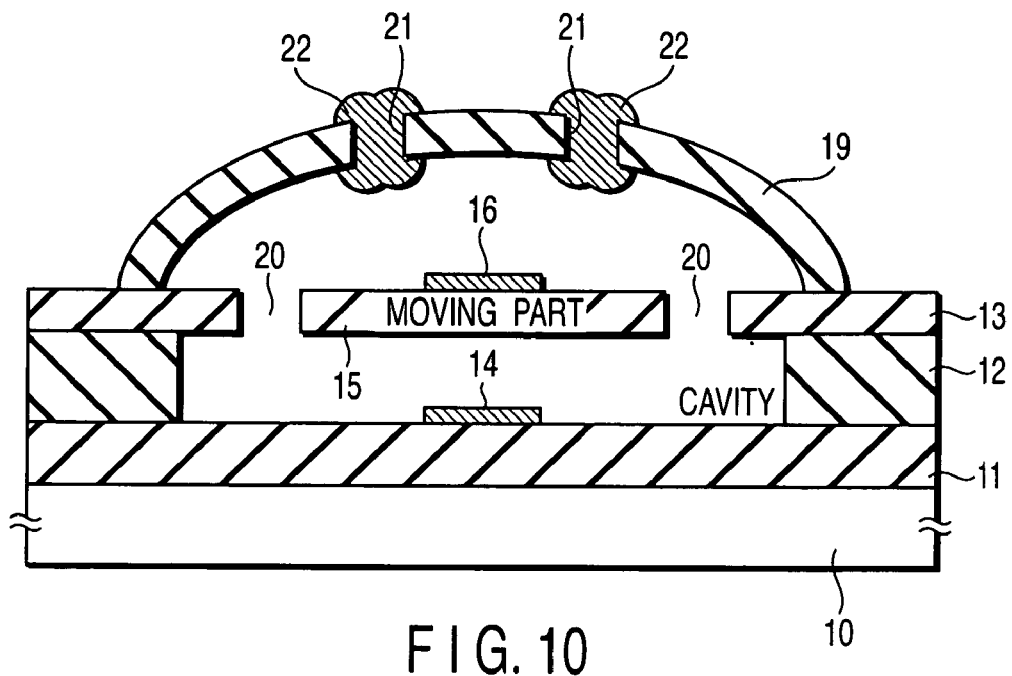
FIG. 10 is a cross-sectional view showing a step in the manufacturing method of the MEMS component depicted in FIGS. 4 and 5.

Then, as shown in FIG. 10, each opening 21 provided to the film 19 constituted of the insulator is closed by a material 22 consisting of, e.g., an insulator, a conductor or a semiconductor by a method such as a CVD method or a sputtering, thereby sealing the cavity.

Figure 11:
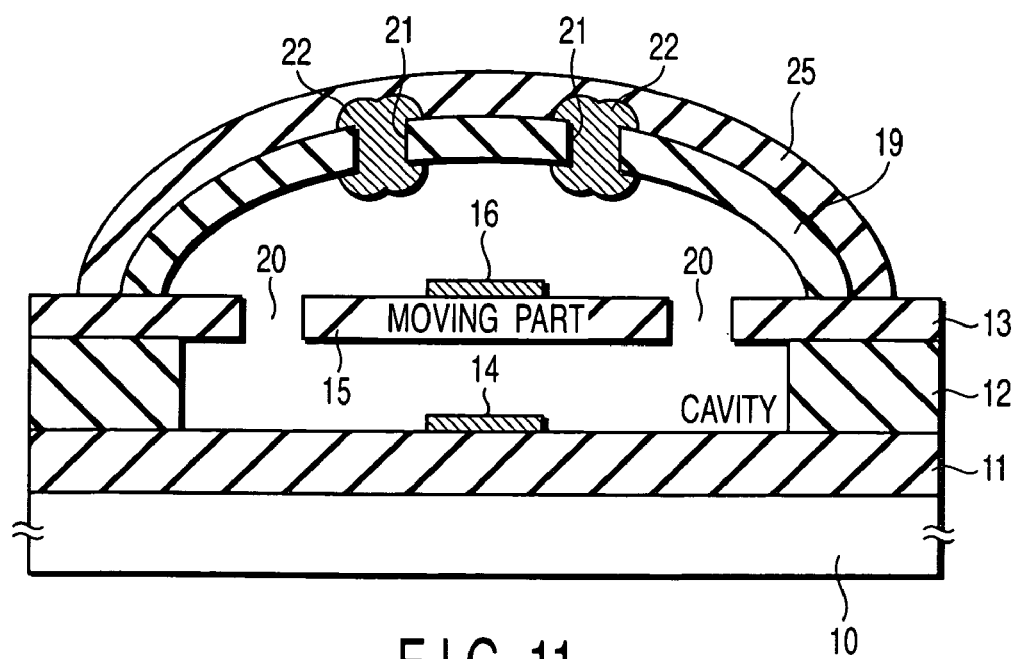
FIG. 11 is a cross-sectional view showing a step in the manufacturing method of the MEMS component depicted in FIGS. 4 and 5.

Here, in case of forming the material 22 which closes each opening 21 by a method using plasma, e.g., plasma CVD, a seam may be formed. In such a case, there is the possibility that water enters from this seam, and hence an insulating film (e.g., silicon oxide) 25 is further superposed on the film 19 constituted of the insulator by the CVD method as shown in FIG. 11, for example.

The insulating film 25 may be formed of the same material as that of the film 19 constituted of the insulator, or may be formed of a different material. Furthermore, it is preferable for the insulating film 25 to be formed of a material having the density higher than that of the film 19 constituted of the insulator.

It is to be noted that the insulating film 25 is not restricted to the insulator, and a conductor or a semiconductor may be used.

The MEMS component shown in FIGS. 4 and 5 is brought to completion by the above-described steps.

d. Summary

According to the first embodiment, the cavity in which the moving part is arranged is sealed by the film formed of a material such as an insulator, a conductor or a semiconductor. As a result, it is possible to provide the MEMS component having the high reliability and a high process yield at a low cost.

(2) Second Embodiment a. Configuration

Figure 12:
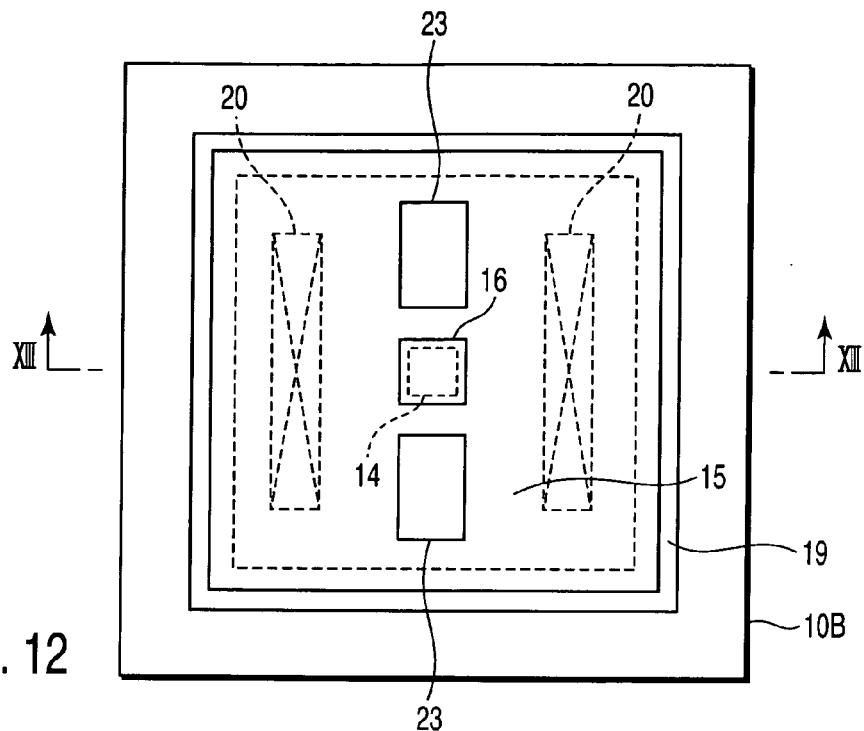
FIG. 12 is a plan view showing a MEMS component according to a second embodiment.
Figure 13:
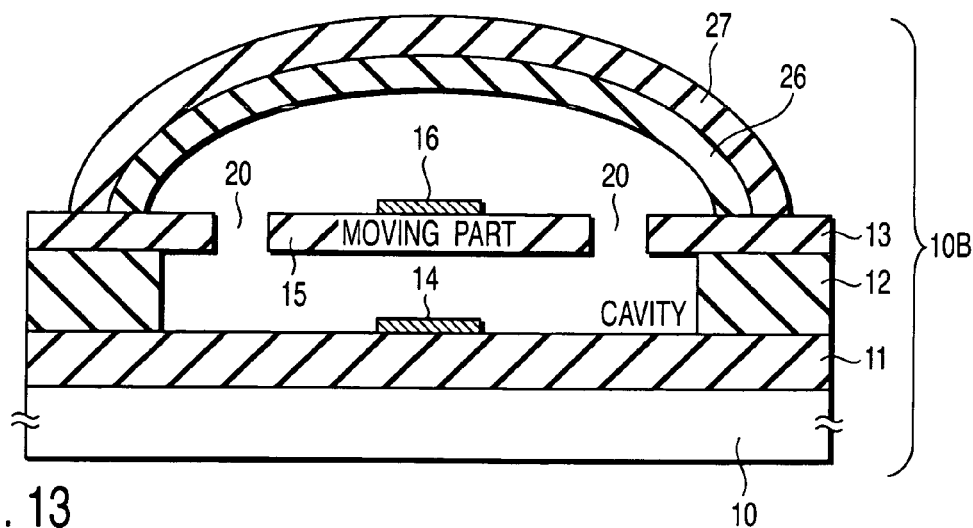
FIG. 13 is a cross-sectional view taken along a line XIII-XIII in FIG. 12.

FIG. 12 shows a MEMS component according to a second embodiment. FIG. 13 is a cross-sectional view taken along a line XIII-XIII in FIG. 12.

An insulating layer 11 is arranged on a semiconductor substrate 10. An insulating layer 12 is arranged on the insulating layer 11. The insulating layer 12 has a groove. This groove is covered with insulating layers 13 and 15. The insulating layers 13 and 15 have openings 20.

The insulating layer 15 functions as a moving part.

An actuator 23 which allows movement of the insulating layer 15 is coupled on the insulating layer 15. Although the actuator 23 is briefly described in the drawing, the actuator 23 may be formed of, e.g., a piezoelectric type like the first embodiment.

A lower electrode 14 is arranged on the insulating layer 11 at a bottom portion of the groove, and an upper electrode 16 is arranged on the insulating layer 15 as a moving part.

A porous film 26 is arranged above the insulating layer 15 as the moving part. The porous film 26 is formed of an insulator, a conductor or a semiconductor. The porous film 26 forms a cavity around the moving part. Moreover, an insulating film 27 having the higher density than that of the porous film 26 is superposed on the porous film 26.

It is to be noted that the insulating film 27 is not restricted to the insulator, and a conductor or a semiconductor may be used.

According to such a configuration, since the cavity is formed by the porous film 26, it is possible to provide the MEMS component having the high reliability and a high process yield at a low cost.

Here, in this example, the porous film 26 has a curved surface. When the porous film 26 is formed to have a curved surface in this manner, an improvement in strength of the porous film 26 and a reduction in the number of production steps can be realized.

Additionally, in this example, since the film which covers the cavity is constituted of the porous film 26, openings do not have to be provided to this porous film 26.

b. Material, Size and Others

As a material, a size and others used for the MEMS component shown in FIGS. 12 and 13, the material, the size and others described in conjunction with the first embodiment can be applied as they are.

As a planar shape of the porous film 26, it is possible to select one from a square shape, a rectangular shape, a circular shape, an elliptic shape, a polygonal shape and others. Further, if the porous film 26 has a circular planar shape, the porous film 26 has a dome-like shape.

c. Manufacturing Method

A manufacturing method of the MEMS component shown in FIGS. 12 and 13 will now be described.

Figure 14:
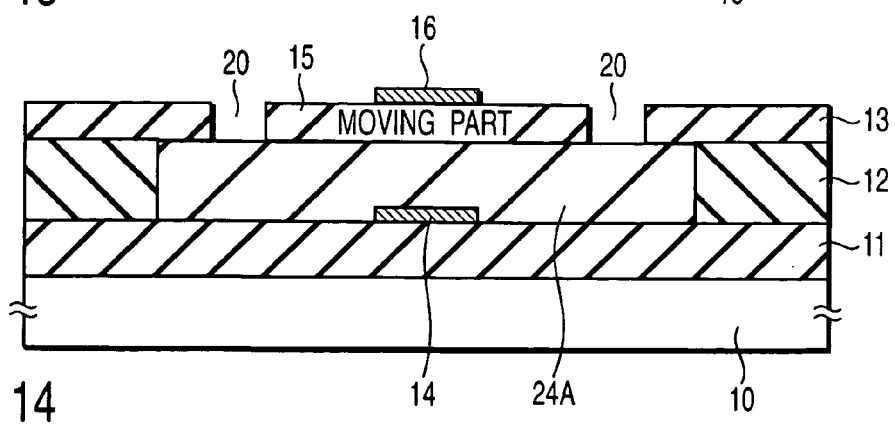
FIG. 14 is a cross-sectional view showing a step in a manufacturing method of the MEMS component depicted in FIGS. 12 and 13.

First, as shown in FIG. 14, an insulating layer (e.g., silicon oxide) 11 having a thickness of approximately 1.3 µm is formed on a semiconductor substrate 10 by using a thermal oxidation method. Furthermore, an insulating layer (e.g., silicon oxide) 12 having a thickness of approximately 1 µm is formed on the insulating layer 11 by a CVD method.

Moreover, a groove is formed to the insulating layer 12 by the PEP. An electroconductive layer 14 is formed on the insulating layers 11 and 12, and the electroconductive layer 14 is patterned by the PEP, thereby obtaining a lower electrode.

Then, a dummy layer 24A which completely fills the groove formed to the insulating layer 12 is formed. As the dummy layer 24A, it is possible to select and use one from a group consisting of a silicon material such as polysilicon or amorphous silicon, an insulating material such as $SiO_2$ or SiN, a metal material such as Ti, TiN, Al, Cu, Ni, Co or Au, an organic material such as polyimide, carbon or resist, and a so-called low-k material having a low dielectric constant.

Subsequently, insulating layers (e.g., silicon oxide) 13 and 15 having a thickness of approximately 100 nm are formed on the insulating layer 12 and the dummy layer 24A by using the CVD method. Here, since the surface of the dummy layer 24A is flattened, the surfaces of the insulating layers 13 and 15 are also flat.

Moreover, openings 20 are formed to the insulating layers 13 and 15 by using the PEP, and an actuator comprising, e.g., a piezoelectric element is formed on the insulating layer 15.

Additionally, an electroconductive layer 16 is formed on the insulating layer 15, and the electroconductive layer 16 is patterned by the PEP, thereby obtaining an upper electrode.

Figure 15:
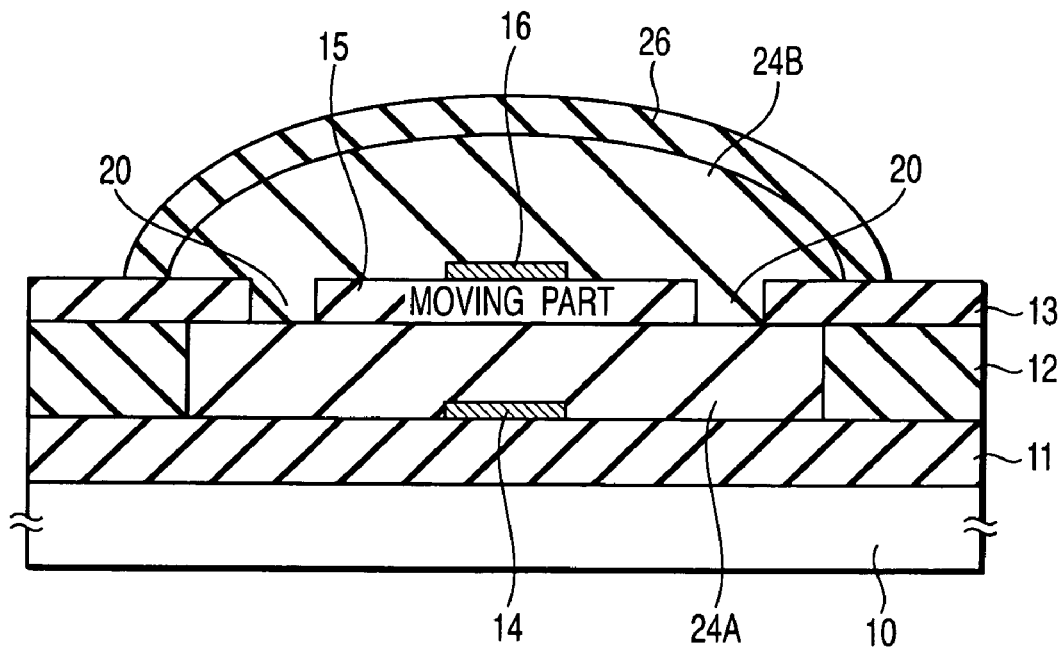
FIG. 15 is a cross-sectional view showing a step in the manufacturing method of the MEMS component depicted in FIGS. 12 and 13.

Then, as shown in FIG. 15, a dummy layer 24B which covers the insulating layer 15 is formed. It is preferable for the dummy layers 24A and 24B to be formed of the same material or a material which can be removed by using the same etchant.

As the dummy layer 24B, it is possible to select and use one from a group consisting of a silicon material such as polysilicon or amorphous silicon, an insulating material such as $SiO_2$ or SiN, a metal material such as Ti, TiN, Al, Cu, Ni, Co or Au, an organic material such as polyimide, carbon or resist and a so-called low-k material having a low dielectric constant like the dummy layer 24A.

A cross-sectional shape and a planar shape of the dummy layer 24B are square when the dummy layer 24B is processed into a shape which covers the moving part.

Accordingly, the dummy layer 24B is then fluidized by performing, e.g., annealing so that the dummy layer 24B has a curved surface by the surface tension. At this time, the dummy layer 24B may still have the square planar shape, or may have a circular or elliptic planar shape.

Then, a porous film 26 is formed on the dummy layer 24B.

Figure 16:
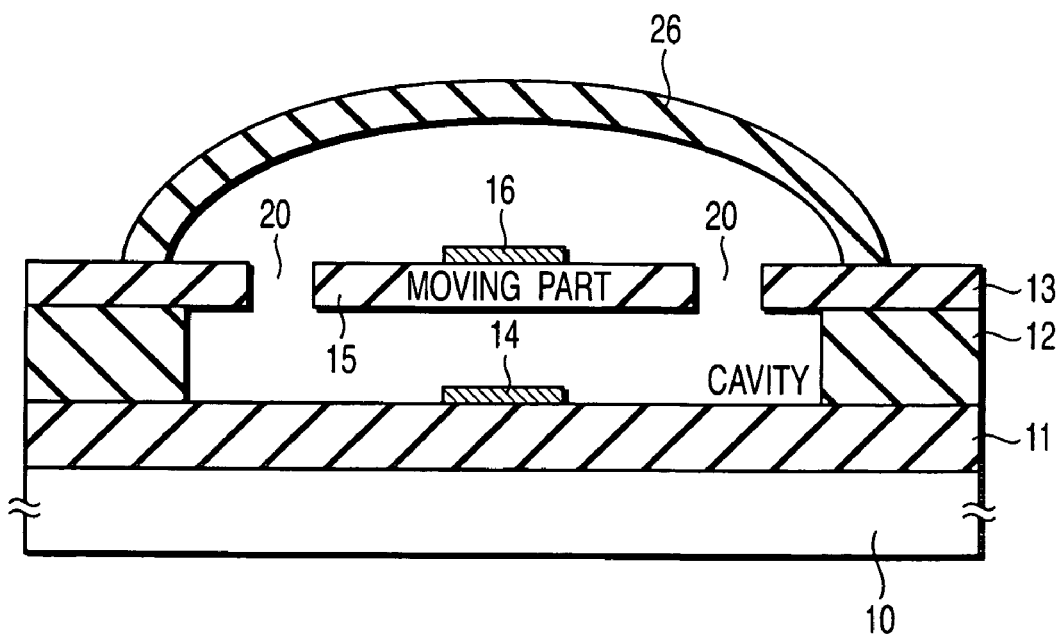
FIG. 16 is a cross-sectional view showing a step in the manufacturing method of the MEMS component depicted in FIGS. 12 and 13.

Thereafter, when the dummy layers 24A and 24B are removed by using a reactive gas or the like, a cavity is formed around the insulating layer 15 as the moving part as shown in FIG. 16.

In this example, the reactive gas or the like permeates the dummy layers 24A and 24B through many holes formed to the porous film 26, openings do not have to be formed to the insulating layer which covers the moving part by etching and such openings do not have to be closed like the first embodiment. That is, a reduction in cost can be realized by decreasing the number of production steps.

It is to be noted that, when the dummy layers 24A and 24B are formed of resist, the dummy layers 24A and 24B can be removed by a vaporizing method called ashing.

Figure 17:
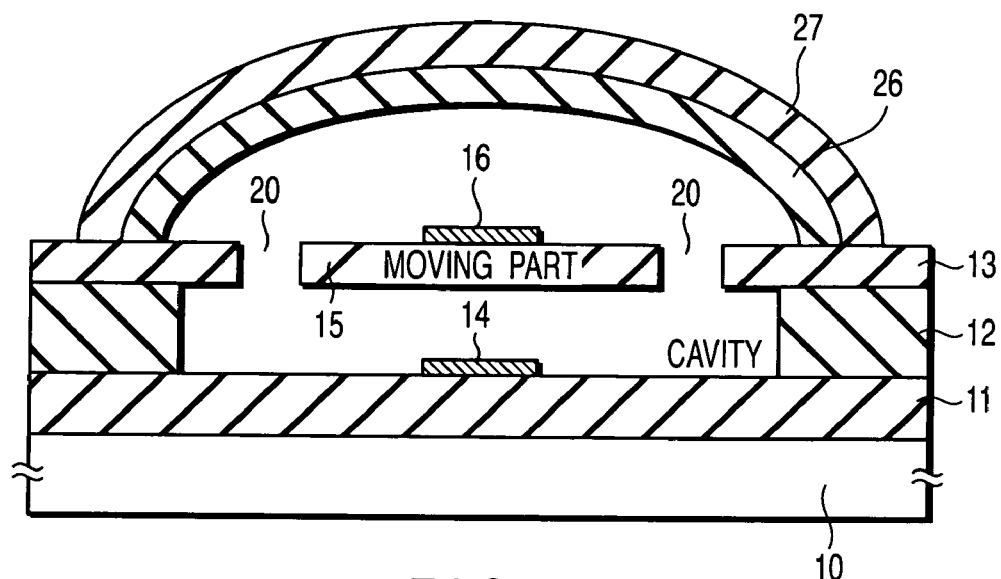
FIG. 17 is a cross-sectional view showing a step in the manufacturing method of the MEMS component depicted in FIGS. 12 and 13.

Then, as shown in FIG. 17, an insulating film (e.g., silicon oxide) 27 is superposed on the porous film 26 by using, e.g., the CVD method.

The insulating film 27 may be formed of the same material as that of the porous film 26, or may be formed of a different material. However, the insulating film 27 is formed of a material having the higher density than that of the porous film 26.

It is to be noted that the insulating film 27 is not restricted to the insulator, and a conductor or a semiconductor may be used.

The MEMS component shown in FIGS. 12 and 13 is brought to completion by the above-described steps.

d. Summary

According to the second embodiment, the cavity in which the moving part is arranged is sealed by the porous film and the insulating layer formed thereon. As a result, the number of production steps can be further reduced as compared with the first embodiment, and the MEMS component having the high reliability and a high process yield can be provided at a low cost.

(3) Third Embodiment

A third embodiment is an improvement of the first and second embodiments. In the third embodiment, in order to suppress bending of the MEMS component in each of the first and second embodiment, columns which reinforce the configuration of the MEMS component are provided in the cavity.

a. Configuration

Figure 18:
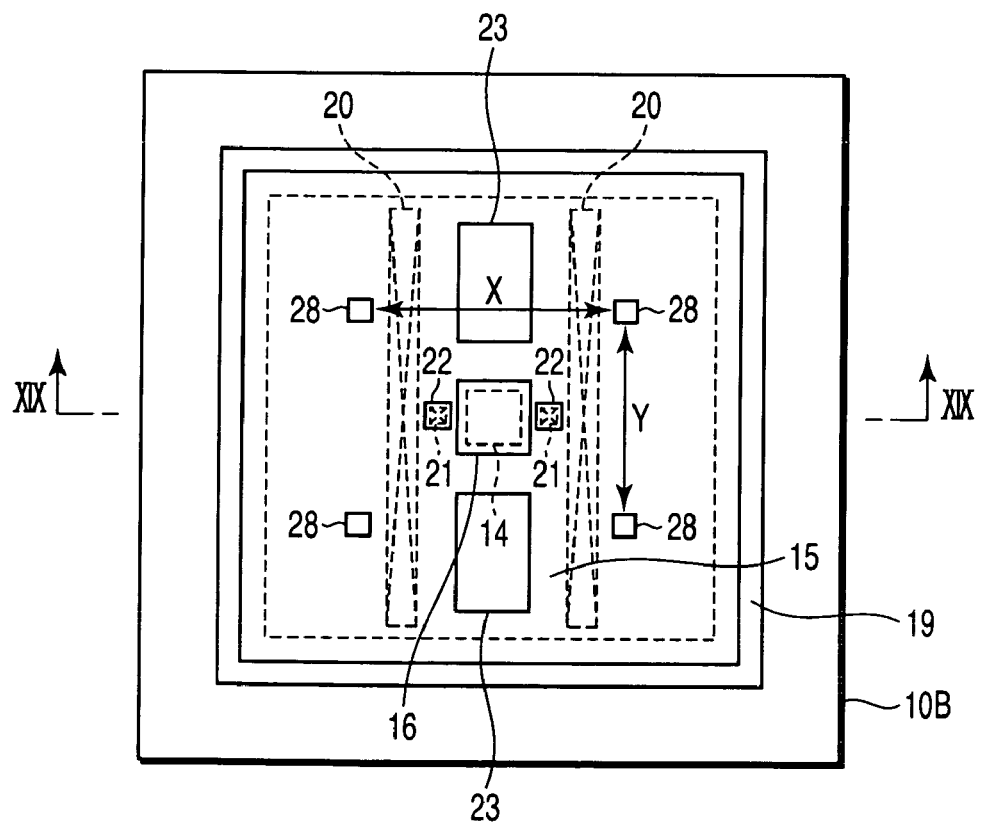
FIG. 18 is a plan view showing a MEMS component according to a third embodiment.

FIG. 18 shows a MEMS component according to the third embodiment. FIG. 19 is a cross-sectional view taken along a line XIX-XIX in FIG. 18.

This example corresponds to the MEMS component according to the first embodiment.

An insulating layer 11 is arranged on a semiconductor substrate 10. An insulating layer 12 is arranged on the insulating layer 11. The insulating layer 12 has a groove. This groove is covered with insulating layers 13 and 15. The insulating layers 13 and 15 have openings 20.

The insulating layer 15 functions as moving part.

An actuator 23 which allows movement of the insulating layer 15 is coupled on the insulating layer 15. Although the actuator 23 is briefly described, the actuator 23 can be constituted of, e.g., a piezoelectric type like the first embodiment.

A lower electrode 14 is arranged on the insulating layer 11 at a bottom portion of the groove, and an upper electrode 16 is arranged on the insulating layer 15 as the moving part.

A film 19 formed of an insulator is arranged above the insulating layer 15 as the moving part. Although the film 19 constituted of the insulator has openings 21, each of these openings 21 is closed by a material 22 formed of, e.g., an insulator, a conductor or a semiconductor. The film 19 constituted of the insulator forms a cavity around the moving part.

Columns 28 which couple the insulating layer 13 with the film 19 constituted of the insulator are arranged on the insulating layer 13 in the cavity. Although a shape of the column 28 is not restricted in particular, it is possible to adopt a shape such as a prismatic shape or a cylindrical shape.

In this example, the four columns 28 are arranged in the cavity. These columns 28 are set in such a manner that their intervals (pitches) X and Y become 500 µm or below. Further, a length (a width) of one side of each column 28 is set to 40 µm or below if these columns 28 have a prismatic shape, and a diameter (a width) of the same is set to 40 µm or below if the columns 28 have a cylindrical shape. The important point of this structure is reinforcing the configuration in the cavity.

Specifically, when a distance between the lower electrode 14 and the upper electrode 16 in an initial state is set to 1 µm and a width of each column 28 is set to 40 µm or below, the intervals X and Y of the columns 28 must be set to 500 µm or below in order to suppress irregularities in distance between the both electrodes caused due to bending within 20% (200 nm).

An insulating film 25 is superposed on the film 19 constituted of the insulator. The insulating film 25 is not restricted to the insulator, and a conductor or a semiconductor may be used.

According to such a configuration, since the configuration in the cavity is reinforced by the columns 28 and bending of the MEMS component is suppressed, it is possible to provide the MEMS component having the higher reliability and a higher process yield.

FIG. 20 shows a MEMS component according to the third embodiment. FIG. 21 is a cross-sectional view taken along a line XXI-XXI in FIG. 20.

This example corresponds to the MEMS component according to the second embodiment.

An insulating layer 11 is arranged on a semiconductor substrate 10. An insulating layer 12 is arranged on the insulating layer 11. The insulating layer 12 has a groove. This groove is covered with insulating layers 13 and 15. The insulating layers 13 and 15 have openings 20.

The insulating layer 15 functions as a moving part. Here, since a type of an actuator which allows movement of the moving part is not important, the actuator is eliminated like the second embodiment.

A lower electrode 14 is arranged on the insulating layer 11 at a bottom portion of the groove, and an upper electrode 16 is arranged on the insulating layer 15 as the moving part.

A porous film 26 is arranged above the insulating layer 15 as a moving part. The porous film 26 is formed of an insulator, a conductor or a semiconductor. The porous film 26 forms a cavity around the moving part.

Columns 28 which couple the insulating layer 13 with the porous film 26 are arranged on the insulating layer 13 in the cavity. Although a shape of each column 28 is not restricted in particular, it is possible to adopt a shape such as a prismatic shape or a cylindrical shape.

In this example, the four columns 28 are likewise arranged in the cavity. These columns 28 are set in such a manner that their intervals (pitches) X and Y become 500 µm or below as shown in FIG. 22, for example. Further, a length (a width) of one side of each column 28 is set to 40 µm or below if each of these columns 28 has a prismatic shape, and a diameter (a width) of the same is set to 40 µm or below if each column 28 has a cylindrical shape. The important point of this structure is reinforcing the configuration in the cavity as described in conjunction with the example shown in FIGS. 18 and 19.

An insulating film 27 having the higher density than that of the porous film 26 is superposed on the porous film 26. The insulating film 27 is not restricted to an insulator, and it is possible to use a conductor or a semiconductor.

According to such a configuration, since the configuration in the cavity is reinforced by the column 28 and bending of the MEMS component is suppressed, it is possible to provide the MEMS component having the higher reliability and a higher yield.

b. Material, Size and Others

In regard to a material, a size and others used for the MEMS component shown in FIGS. 18 to 21, the material, the size and others described in conjunction with the first to third embodiments can be applied as they are.

c. Manufacturing Method

A manufacturing method of the MEMS component shown in FIGS. 20 and 21 will now be described.

First, as shown in FIG. 23, an insulating layer (e.g., silicon oxide) 11 having a thickness of approximately 1.3 µm is formed on a semiconductor substrate 10 by using a thermal oxidation method. Further, an insulating layer (e.g., silicon oxide) 12 having a thickness of approximately 1 µm is formed on the insulating layer 11 by using a CVD method.

Furthermore, a groove is formed to the insulating layer 12 by a PEP. An electroconductive layer 14 is formed on the insulating layers 11 and 12, and the electroconductive layer 14 is patterned by the PEP, thereby obtaining a lower electrode.

Subsequently, a dummy layer 24A which completely fills the groove formed to the insulating layer 12 is formed. As the dummy layer 24A, it is possible to select and use one from a group consisting of a silicon material such as polysilicon or amorphous silicon, an insulating material such as $SiO_2$ or SiN, a metal material such as Ti, TiN, Al, Cu, Ni, Co or Au, an organic material such as polyimide, carbon or resist, and a so-called low-k material having a low dielectric constant.

Then, insulating layers (e.g., silicon oxide) 13 and 15 having a thickness of approximately 100 nm are formed on the insulating layer 12 and the dummy layer 24A by using the CVD method. Here, since the surface of the dummy layer 24A is flattened, the surfaces of the insulating layers 13 and 15 are also flat.

Moreover, openings 20 are formed to the insulating layers 13 and 15 by using the PEP, and an actuator comprising, e.g., a piezoelectric element is further formed on the insulating layer 15.

Additionally, an electroconductive layer 16 is formed on the insulating layer 15, and the electroconductive layer 16 is patterned by the PEP, thereby obtaining an upper electrode.

Figure 24:
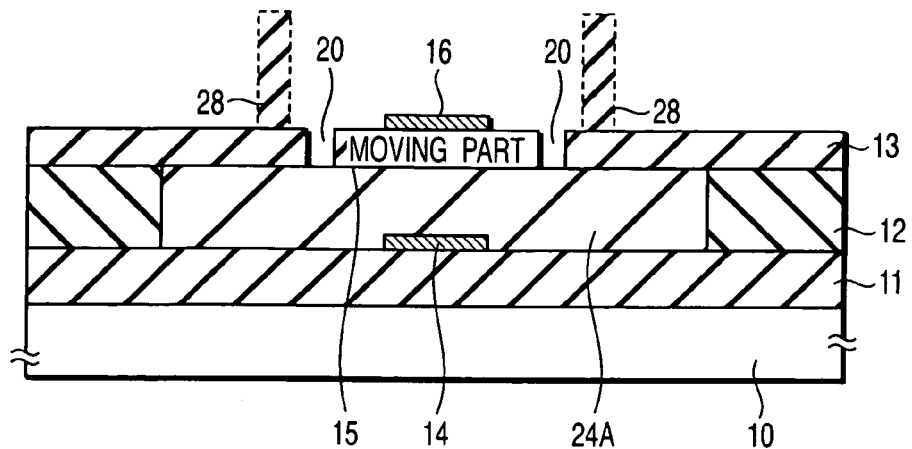
FIG. 24 is a cross-sectional view showing a step in the manufacturing method of the MEMS component depicted in FIGS. 20 and 21.

Then, as shown in FIG. 24, columns 28 each comprising, e.g., an insulator are formed on the insulating layer 13. The column 28 may comprise a conductor or a semiconductor in place of the insulator.

The column 28 is formed by utilizing, e.g., a deposition method such as CVD, a mask creation method such as photolithography or an etching method such as RIE.

Figure 25:
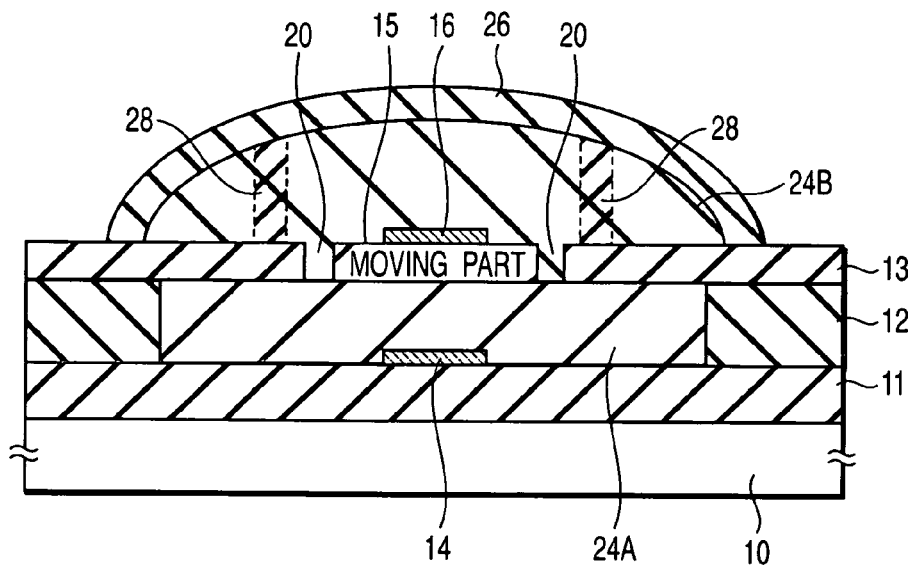
FIG. 25 is a cross-sectional view showing a step in the manufacturing method of the MEMS component depicted in FIGS. 20 and 21.

Then, as shown in FIG. 25, a dummy layer 24B which covers the insulating layer 15 is formed. It is preferable for the dummy layers 24A and 24B to be formed of the same material or a material which can be removed by the same etchant.

As the dummy layer 24B, it is possible to select and use one from a group consisting of a silicon material such as polysilicon or amorphous silicon, an insulating material such as $SiO_2$ or SiN, a metal material such as Ti, TiN, Al, Cu, Ni, Co or Au, an organic material such as polyimide, carbon or resist, and a so-called low-k material having a low dielectric constant like the dummy layer 24A.

A cross-sectional shape and a planar shape of the dummy layer 24B are square when the dummy layer 24B is processed into a shape which covers the insulating layer 15.

Thus, the dummy layer 24B is then fluidized by performing, e.g., annealing so that the dummy layer 24B has a curved surface by the surface tension. At this time, the dummy layer 24B may still have the square planar shape, or may have a circular or elliptic planar shape.

Moreover, a porous film 26 is formed on the dummy layer 24B.

Figure 26:
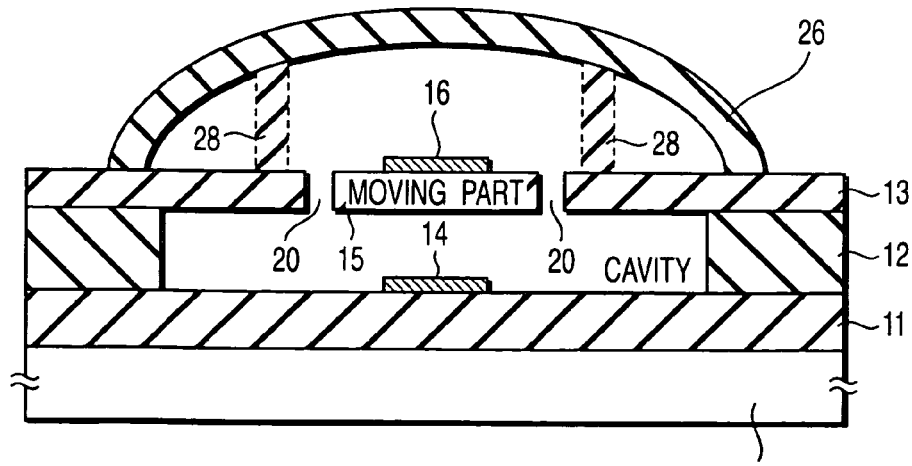
FIG. 26 is a cross-sectional view showing a step in the manufacturing method of the MEMS component depicted in FIGS. 20 and 21.

Thereafter, when the dummy layers 24A and 24B are removed by using a reactive gas or the like, a cavity is formed around the insulating layer 15 as the moving part as shown in FIG. 26.

It is to be noted that, when each of the dummy layers 24A and 24B is formed of resist, the dummy layers 24A and 24B can be removed by a vaporizing method called ashing.

Figure 27:
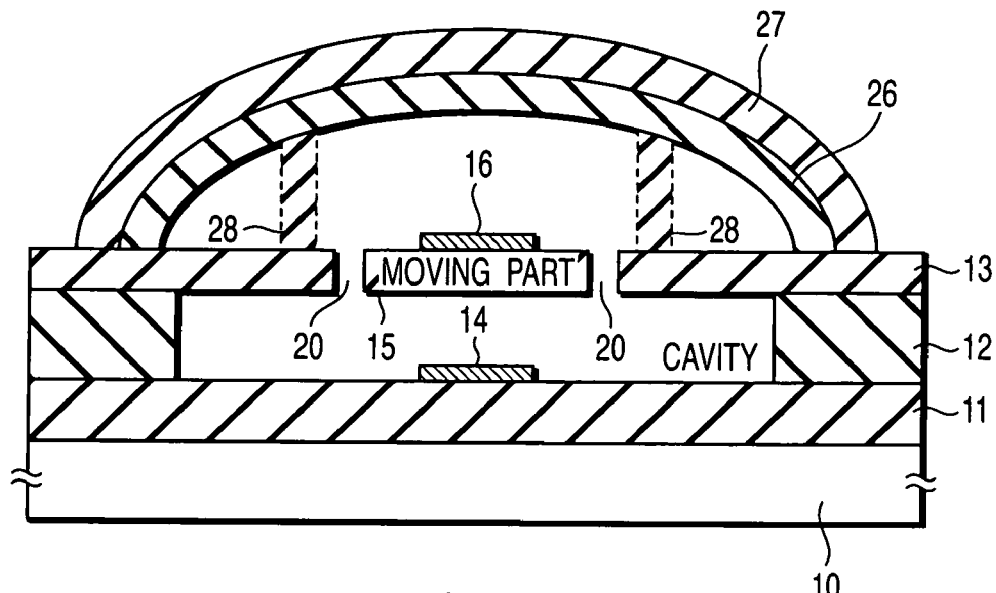
FIG. 27 is a cross-sectional view showing a step in the manufacturing method of the MEMS component depicted in FIGS. 20 and 21.

Then, as shown in FIG. 27, an insulating film (e.g., silicon oxide) 27 is superposed on the porous film 26 by using, e.g., the CVD method.

The insulating film 27 may be formed of the same material as that of the porous film 26, or may be formed of a different material. However, the insulating film 27 is formed of a material having the density higher than that of the porous film 26.

It is to be noted that the insulating film 27 is not restricted to the insulator, and a conductor or a semiconductor may be used.

The MEMS component shown in FIGS. 20 and 21 is brought to completion by the above-described steps.

d. Summary

According to the third embodiment, the columns which reinforce the configuration of the MEMS component are provided in the cavity in order to suppress bending of the MEMS component. As a result, the MEMS component having the high reliability and a high process yield can be provided.

4. MODIFICATIONS

A modification of the MEMS components according to each of the first to third embodiments will now be described. This modification is characterized in that the film arranged above the cavity does not have a curved surface but has a flat surface parallel to the surface of the semiconductor substrate.

Figure 28:
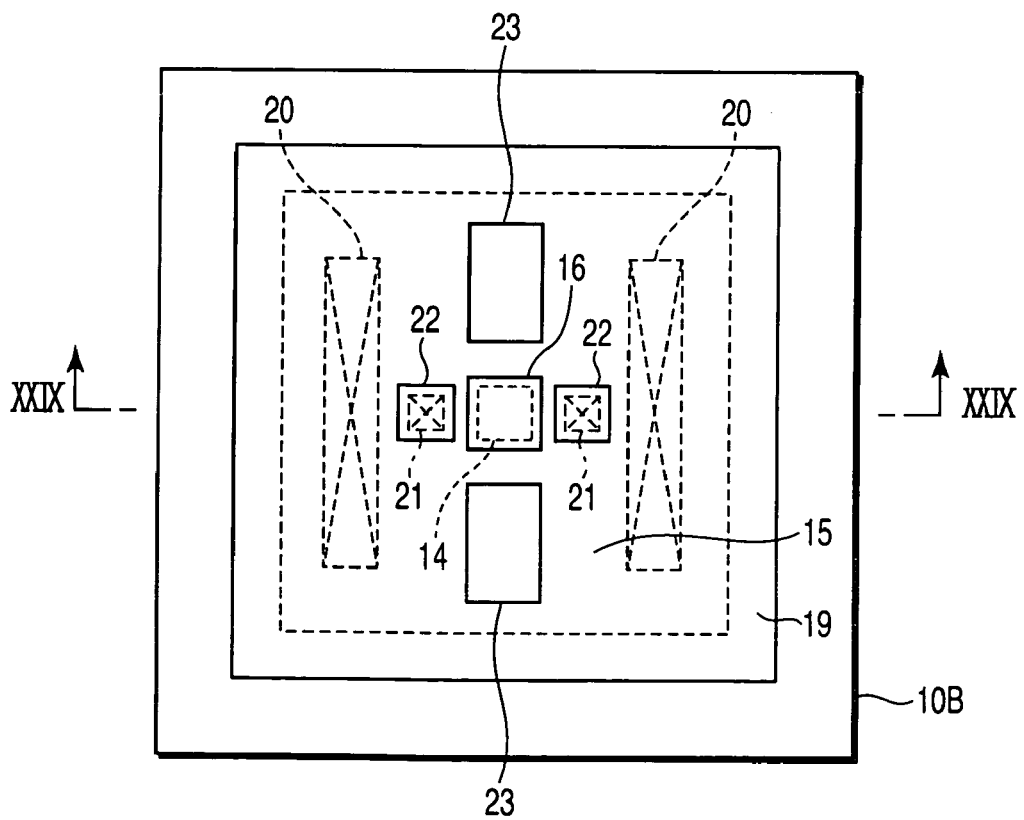
FIG. 28 is a plan view showing a MEMS component concerning a modification of the first embodiment.

A MEMS component shown in FIGS. 28 and 29 corresponds to a modification of the MEMS component shown in FIG. 11 as the first embodiment.

An insulating layer 19' is arranged on an insulating layer 13, and a film 19 which is formed of an insulator covering a cavity is arranged on the insulating layer 19'. This film 19 has a flat surface parallel to a surface of a semiconductor substrate 10. Although the film 19 formed of the insulator has openings 21, each of these openings 21 is closed by a material 22 such as an insulator, a conductor or a semiconductor.

An insulating film 25 is arranged on the film constituted of the insulator.

The insulating film 25 may be formed of the same material as that of the film 19 constituted of the insulator, or may be formed of a different material. Additionally, it is preferable for the insulating film 25 to be formed of a material having the density higher than that of the film 19 constituted of the insulator.

As to the film 19 constituted of the insulator, it is possible to use a conductor or a semiconductor instead.

Figure 31:
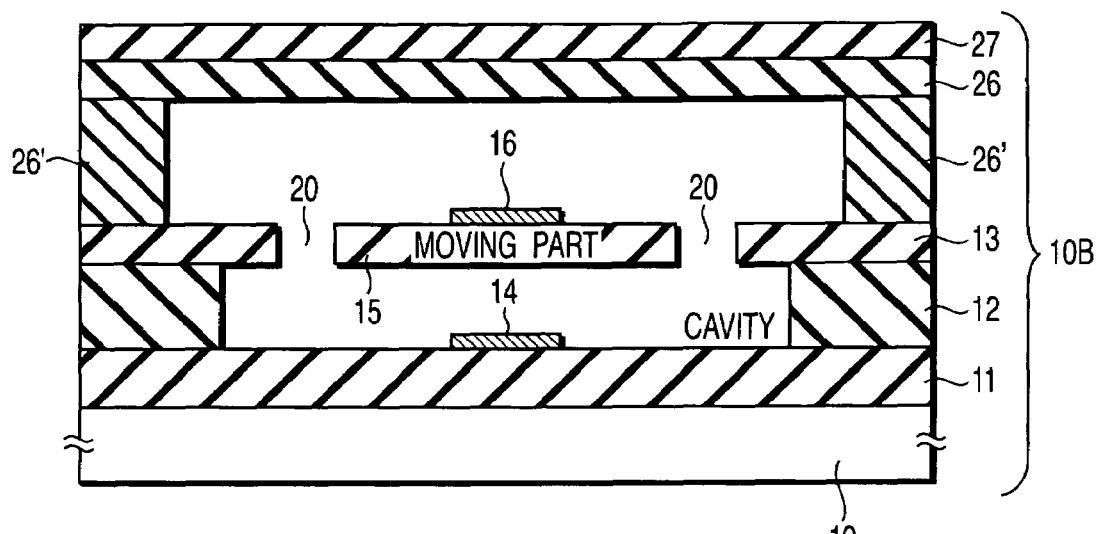
FIG. 31 is a cross-sectional view taken along a line XXXI-XXXI in FIG. 30.

The MEMS component shown in FIGS. 30 and 31 corresponds to a modification of the MEMS component depicted in FIGS. 12 and 13 as the second embodiment.

An insulating layer 26' is arranged on the insulating layer 13, and a porous film 26 which covers the cavity is arranged on the insulating layer 26'. The porous film 26 has a flat surface parallel to the surface of the semiconductor substrate 10.

An insulating film 27 is superposed on the porous film 26.

The insulating film 27 may be formed of the same material as that of the porous film 26, or may be formed of a different material. However, the insulating film 27 is formed of a material having the density higher than that of the porous film 26.

The porous film 26 can be formed of a material such as an insulator, a conductor or a semiconductor.

Figure 32:
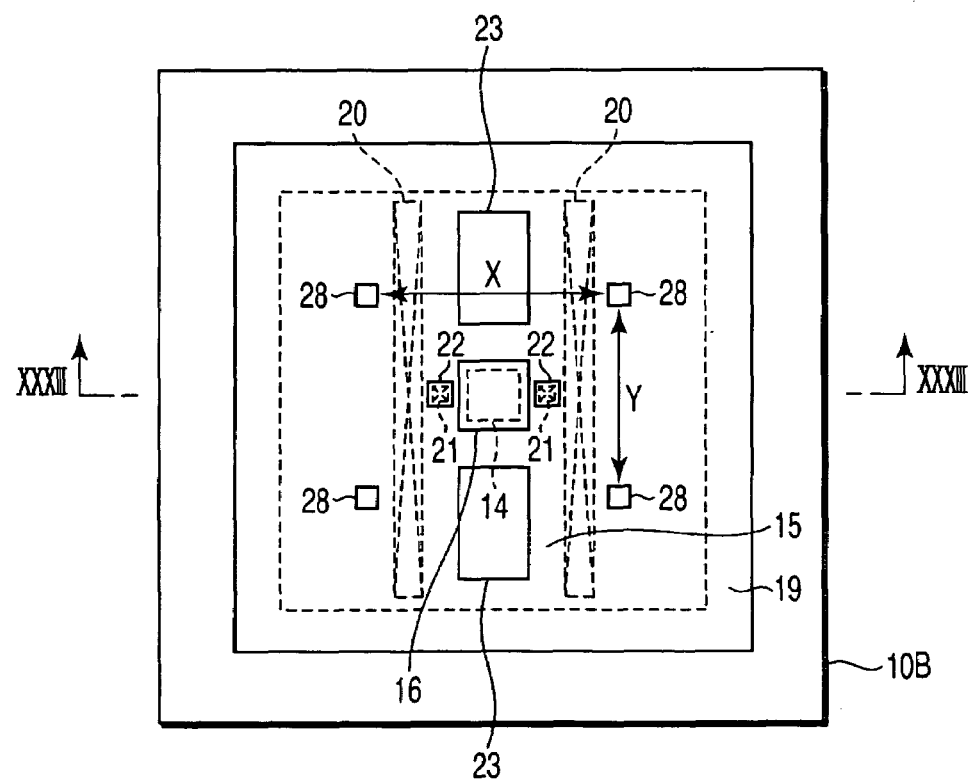
FIG. 32 is a plan view showing a MEMS component concerning a modification of the third embodiment.
Figure 33:
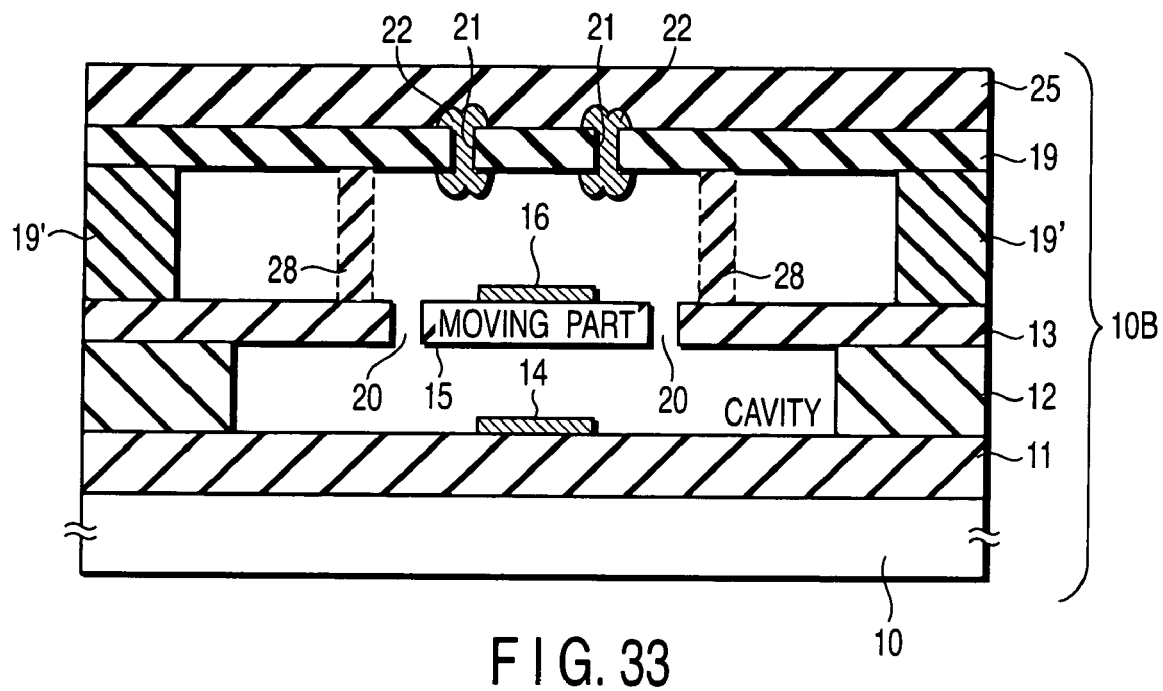
FIG. 33 is a cross-sectional view taken along a line XXXIII-XXXIII in FIG. 32.

The MEMS component shown in FIGS. 32 and 33 corresponds to a modification of the MEMS component depicted in FIGS. 18 and 19 as the third embodiment.

An insulating layer 19' is arranged on the insulating layer 13, and columns 28 which reinforce the configuration in the cavity are arranged. A film 19 constituted of an insulator is arranged on the insulating layer 19' and the columns 28. This film 19 has a flat surface parallel to a surface of the semiconductor substrate 10. Although the film 19 constituted of the insulator has openings 21, each of these openings 21 is closed by a material 22 such as an insulator, a conductor or a semiconductor.

An insulating film 25 is superposed on the film 19 constituted of the insulator.

The insulating film 25 may be formed of the same material as that of the film 19 constituted of the insulator, or may be formed of a different material. Further, it is preferable for the insulating film 25 to be formed of a material having the density higher than that of the film 19 constituted of the insulator.

Incidentally, as to the film 19 constituted of the insulator, it is possible to use a conductor or a semiconductor instead.

Figure 34:
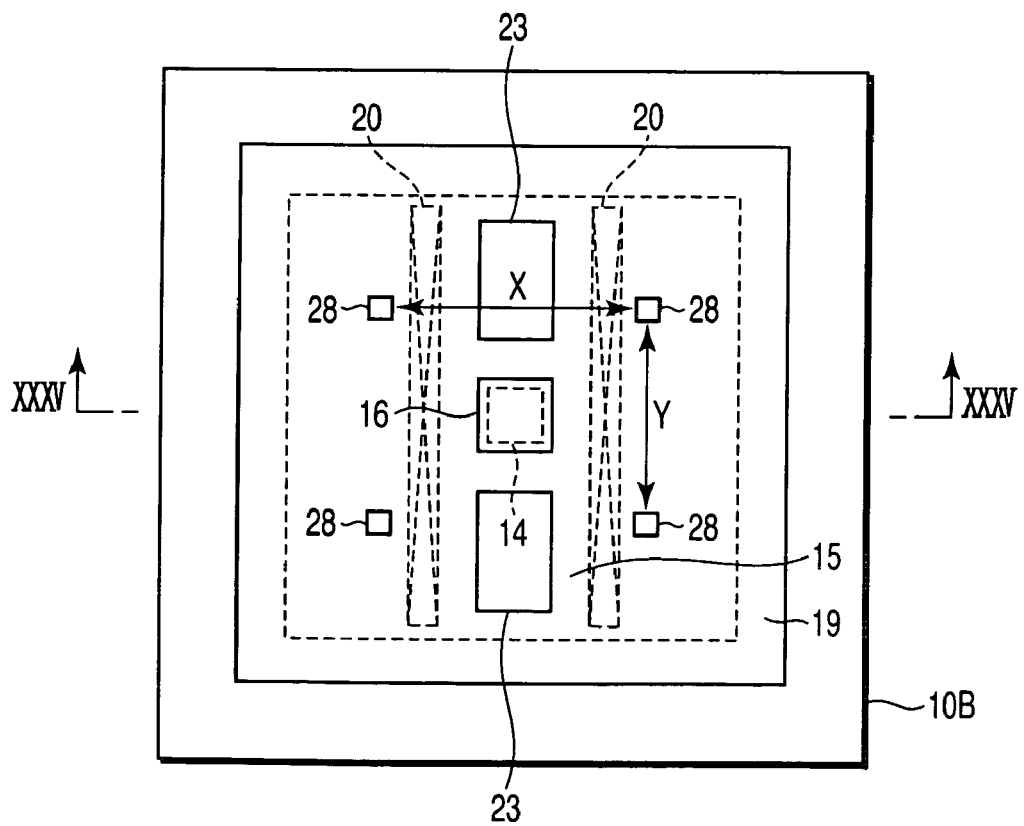
FIG. 34 is a plan view showing a MEMS component concerning a modification of the third embodiment.
Figure 35:
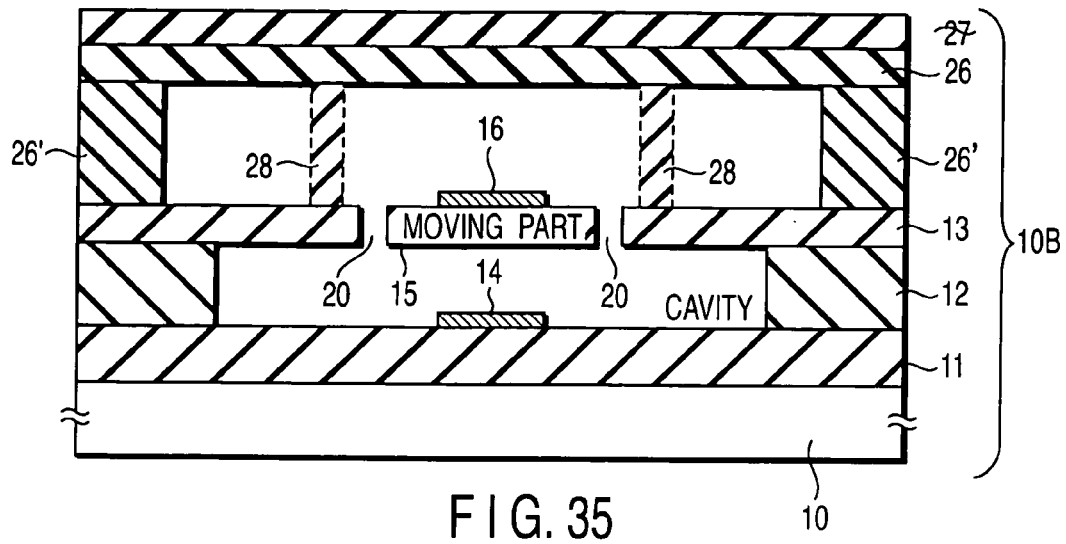
FIG. 35 is a cross-sectional view taken along a line XXXV-XXXV in FIG. 34.

The MEMS component shown in FIGS. 34 and 35 corresponds to a modification of the MEMS component shown in FIGS. 20 and 21 as the third embodiment.

An insulating layer 26' and columns 28 which reinforce the configuration in a cavity are arranged on an insulating layer 13. A porous film 26 is arranged on the insulating layer 26' and the columns 28. The porous film 26 has a flat surface parallel to a surface of a semiconductor substrate 10.

An insulating film 27 is superposed on the porous film 26.

The insulating film 27 may be formed of the same material as that of the porous film 26, or may be formed of a different material. However, the insulating film 27 is formed of a material having the density higher than that of the porous film 26.

The porous film 26 can be formed of a material such as an insulator, a conductor or a semiconductor.

In such a modification, it is possible to obtain the effects of the high reliability, a high process yield and a low cost like the first to third embodiments.

5. EXAMPLE OF HOW TO CLOSE OPENINGS

In the first embodiment, the openings are provided to the film which covers the cavity, and each of these opening is closed by a material such as an insulator, a conductor or a semiconductor. Here, in case of closing the opening by a method such as CVD or sputtering, a part of the film is stored in the cavity as a deposit, which may possibly affect the operation of the MEMS component.

Thus, here, there is proposed a method by which an excessive deposit is not stored in the cavity when closing each opening.

(1) Configuration

Figure 36:
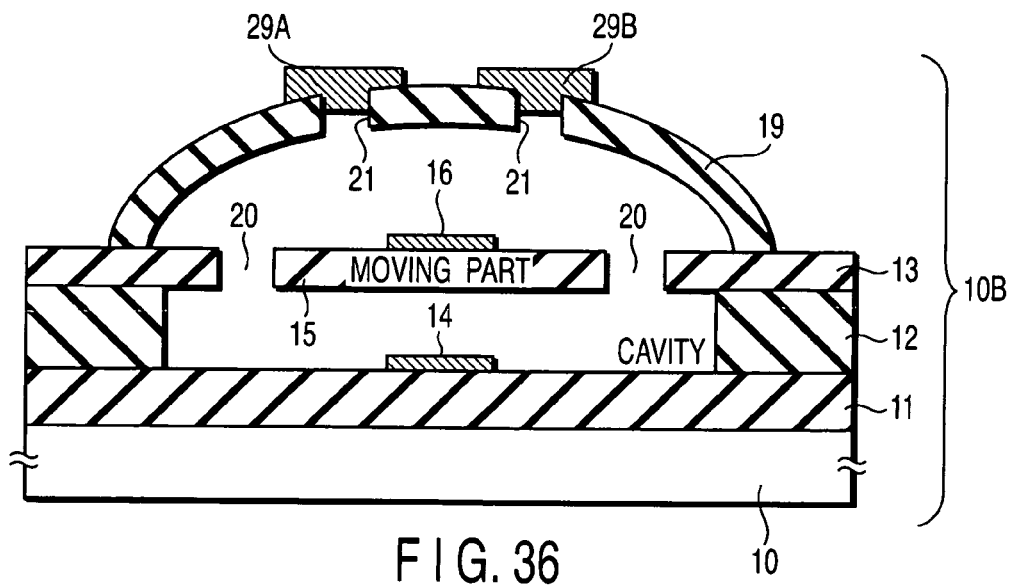
FIG. 36 is a cross-sectional view showing a MEMS component to which a method of closing an opening according to an example of the present invention is applied.

FIG. 36 shows a MEMS component to which the method according to an example of the present invention is applied.

An insulating layer is arranged on a semiconductor substrate 10. An insulating layer 12 is arranged on the insulating layer 11. The insulating layer 12 has a groove. This groove is covered with insulating layers 13 and 15. The insulating layers 13 and 15 have openings 20.

The insulating layer 15 functions as a moving part.

An actuator which allows movement of the insulating layer 15 is coupled on the insulating layer 15, but the detail of the actuator is eliminated here.

A lower electrode 14 is arranged on the insulating layer 11 at a bottom portion of the groove, and an upper electrode 16 is arranged on the insulating layer 15 as a moving part.

A film 19 formed of an insulator is arranged above the insulating layer 15 as the moving part. Although the film 19 constituted of the insulator has openings 21, each of these openings 21 is closed by a material 29B such as an insulator, a conductor or a semiconductor. The film 19 constituted of the insulator forms a cavity around the moving part.

(2) Manufacturing Method a. First Example

Figure 37:
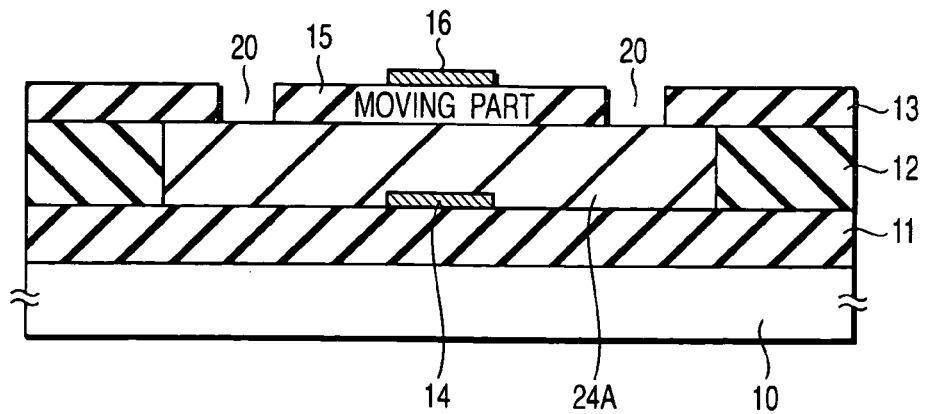
FIG. 37 is a cross-sectional view showing a step in a method of closing an opening according to an example of the present invention.

First, as shown in FIG. 37, an insulating layer (e.g., silicon oxide) 11 is formed on a semiconductor substrate 10 by using a thermal oxidation method. Furthermore, an insulating layer (e.g., silicon oxide) 12 is formed on the insulating layer 11 by using a CVD method.

Moreover, a groove is formed to the insulating layer 12 by a PEP. An electroconductive layer 14 is formed on the insulating layers 11 and 12, and the electroconductive layer 14 is patterned by the PEP, thereby obtaining a lower electrode.

Then, a dummy layer 24A which completely fills the groove formed to the insulating layer 12 is formed. As the dummy layer 24A, it is possible to select and use one from a group consisting of a silicon material such as polysilicon or amorphous silicon, an insulating material such as $SiO_2$ or SiN, a metal material such as Ti, TiN, Al, Cu, Ni, Co or Au, an organic material such as polyimide, carbon or resist, and a so-called low-k material having a low dielectric constant.

Insulating layers (e.g., silicon oxide) 13 and 15 are then formed on the insulating layer 12 and the dummy layer 24A by using a CVD method. Here, since a surface of the dummy layer 24A is flattened, surfaces of the insulating layers 13 and 15 are also flat.

Then, openings 20 are formed to the insulating layers 13 and 15 by using the PEP, and an actuator comprising, e.g., a piezoelectric element is formed on the insulating layer 15.

An electroconductive layer 16 is formed on the insulating layer 15, and the electroconductive layer 16 is patterned by the PEP, thereby obtaining an upper electrode.

Figure 38:
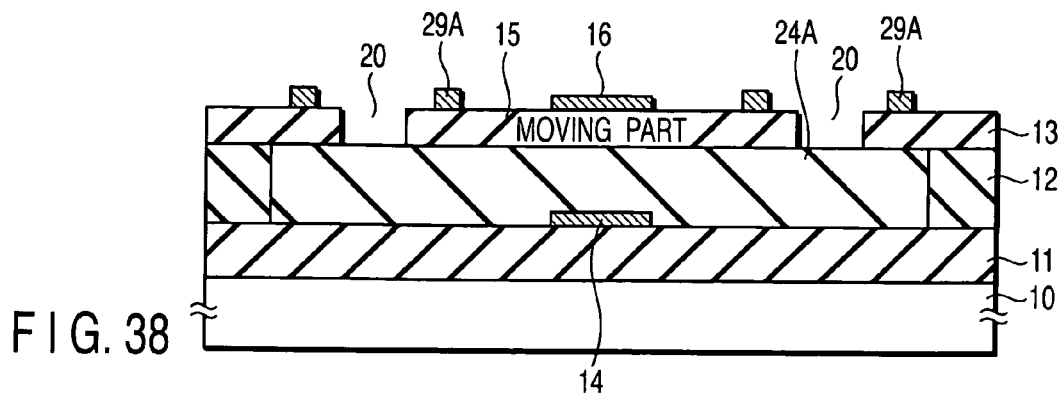
FIG. 38 is a cross-sectional view showing a step in the method of closing the opening according to the example of the present invention.

Subsequently, as shown in FIG. 38, a seed layer 29A which is a seed of selective growth is formed around each opening 20. The seed layer 29A may be partially provided around each opening 20, or may be annularly formed to surround each opening 20. Additionally, the seed layer 29A may be linearly formed along one side of the opening 20.

The seed layer 29A is formed of a material such as Si or SiGe.

It is to be noted that the order of forming the upper electrode 16, the openings 20 and the seed layer 29A may be appropriately changed.

Figure 39:
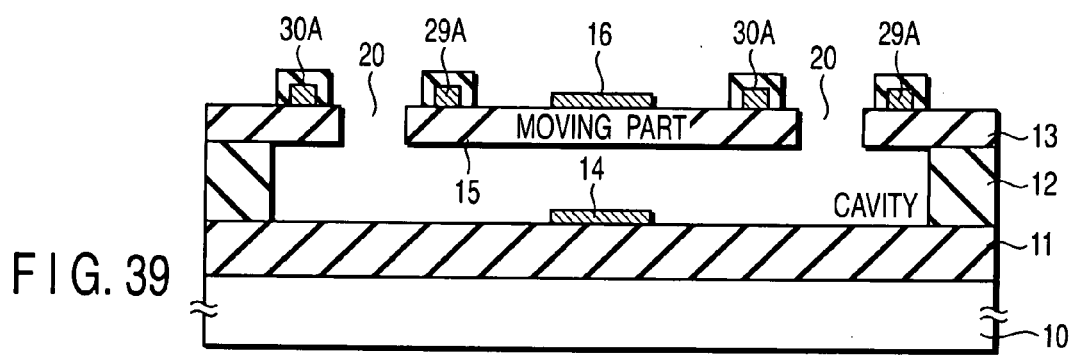
FIG. 39 is a cross-sectional view showing a step in the method of closing the opening according to the example of the present invention.

Then, as shown in FIG. 39, when the dummy layer 24A is removed by using a reactive gas, a chemical or the like, a cavity is formed.

Here, if the dummy layer 24A shown in FIG. 38 is formed of resist, the dummy layer 24A can be removed by a vaporizing method called ashing which uses an oxygen gas. In this case, an oxidized layer 30A is formed on the surface of the seed layer 29A as shown in FIG. 39.

Therefore, this oxidized layer 30A is removed before advancing to the next step.

Figure 40:
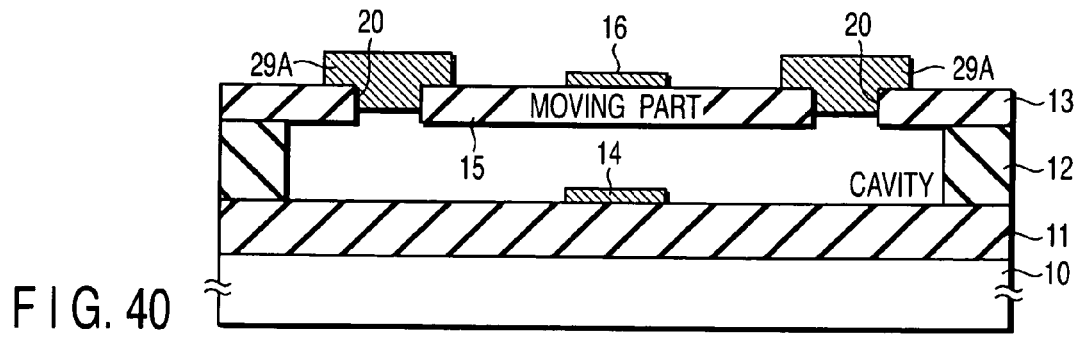
FIG. 40 is a cross-sectional view showing a step in the method of closing the opening according to the example of the present invention.

Subsequently, as shown in FIG. 40, the seed layer 29A is allowed to grow by a selective growth method, and the openings 20 provided to the insulating layers 13 and 15 are closed.

Figure 41:
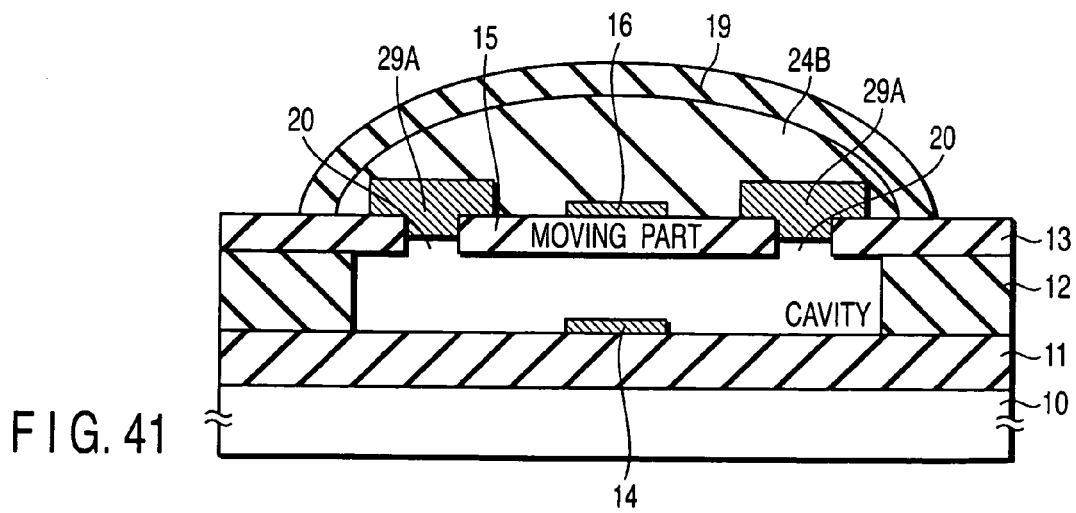
FIG. 41 is a cross-sectional view showing a step in the method of closing the opening according to the example of the present invention.

Then, as shown in FIG. 41, a dummy layer 24B which covers the insulating layer 15 and the seed layer 29A is formed. The dummy layer 24B is formed of the same material as that of the dummy layer 24A depicted in FIG. 37, for example.

As the dummy layer 24B, it is possible to select and use one from a group consisting of a silicon material such as polysilicon or amorphous silicon, an insulating material such as $SiO_2$ or SiN, a metal material such as Ti, TiN, Al, Cu, Ni, Co or Au, an organic material such as polyimide, carbon or resist, and a so-called low-k material having a low dielectric constant.

A cross-sectional shape and a planar shape of the dummy layer 24B are square when the dummy layer 24B is processed into a shape which covers the insulating layer 15.

In this example, the dummy layer 24B is then fluidized by performing, e.g., annealing so that the dummy layer 24B has a curved surface by the surface tension. At this moment, the dummy layer 24B may still have the square planar shape, or may have a circular or elliptic planar shape.

Then, a film (e.g., silicon oxide) 19 constituted of an insulator is formed on the dummy layer 24B. As to the film 19 constituted of the insulator, this film 19 can be formed of a conductor or a semiconductor in place of the insulator.

Figure 42:
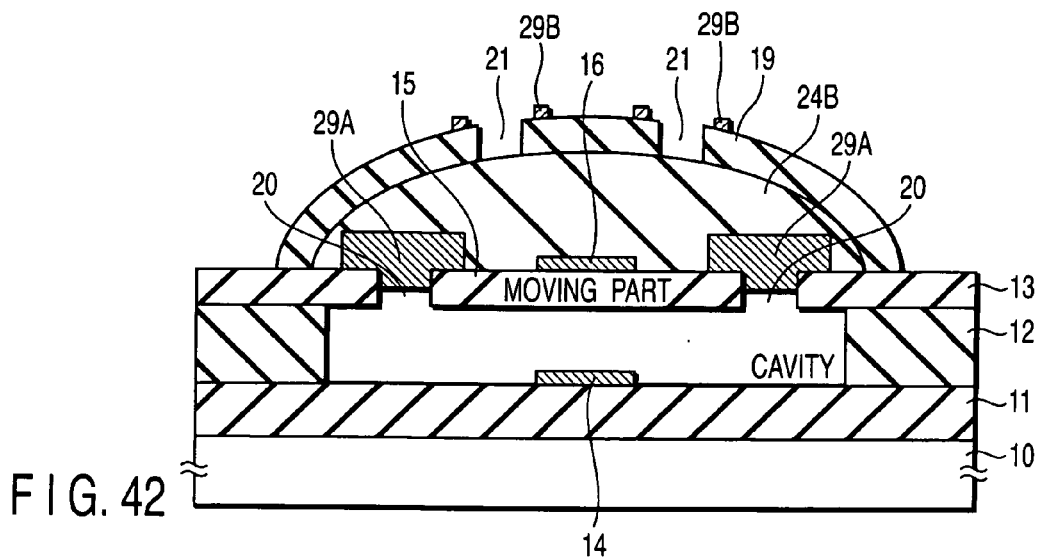
FIG. 42 is a cross-sectional view showing a step in the method of closing the opening according to the example of the present invention.

Subsequently, as shown in FIG. 42, openings 21 are formed to the film 19 constituted of the insulator by using the PEP. The number of the openings 21 may be a singular number or a plural number. Further, as to a position of each opening 21, the opening 21 is provided at a position where it does not overlap the opening 20 while considering a step of closing the opening 21 which will be carried out later.

Then, a seed layer 29B which serves as a seed of selective growth is formed around each opening 21. The seed layer 29B may be partially provided around each opening 21, or may be annularly formed to surround each opening 21. Furthermore, the seed layer 29B may be linearly formed along one side of each opening 21.

The seed layer 29B is formed of a material such as Si or SiGe.

Figure 43:
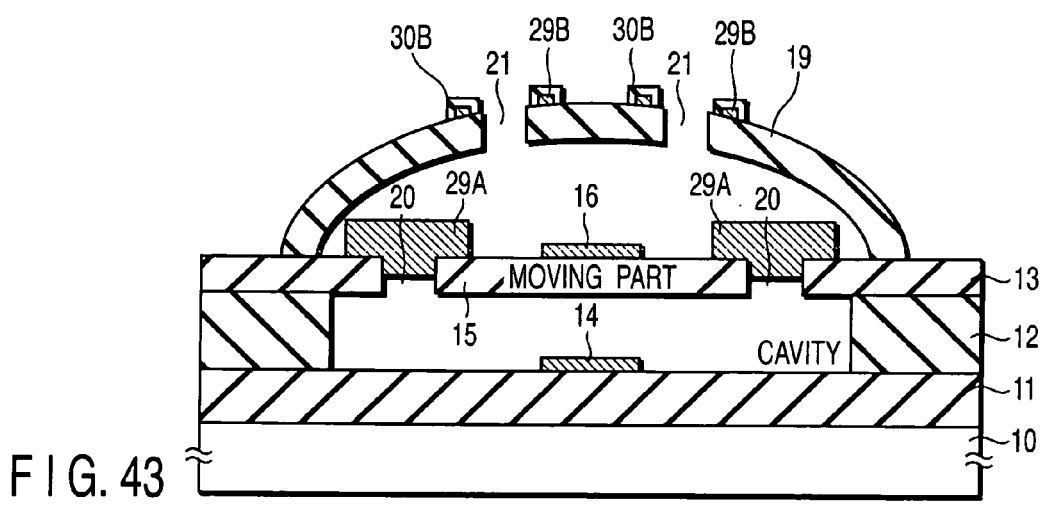
FIG. 43 is a cross-sectional view showing a step in the method of closing the opening according to the example of the present invention.

Then, as shown in FIG. 43, when the dummy layer 24B depicted in FIG. 42 is removed by using a chemical, a reactive gas or the like, a cavity is formed around the insulating layer 15 as the moving part.

It is to be noted that, when the dummy layer 24B is formed of resist, the dummy layer 24B can be removed by a vaporizing method called ashing. In this case, an oxidized layer 30B is formed on the surface of the seed layer 29B after removing the dummy layer 24B.

Therefore, this oxidized layer 30B is removed before advancing to the next step.

Moreover, the seed layer 29A in the cavity which closes each opening 20 is also removed. As a result, the moving part can move.

Figure 44:
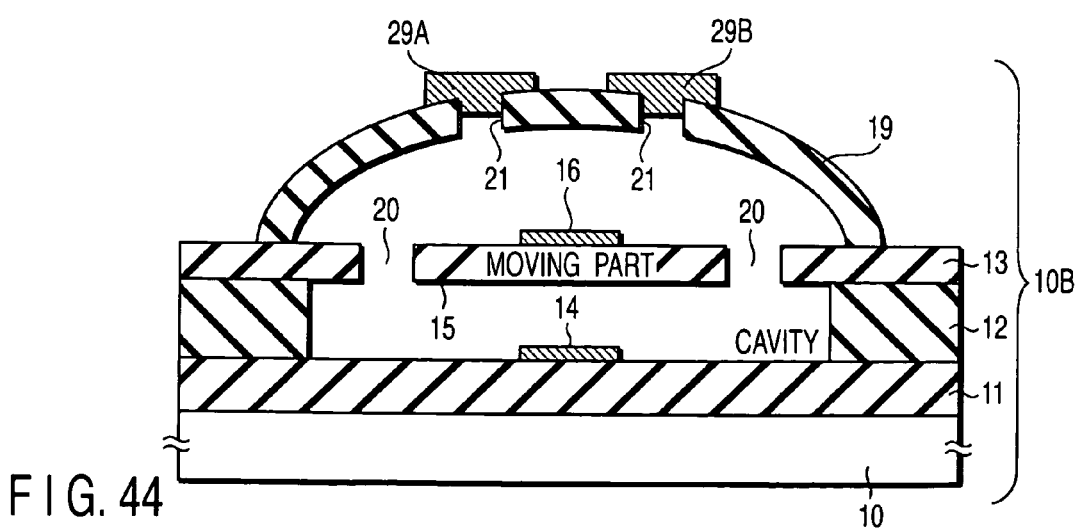
FIG. 44 is a cross-sectional view showing a step in the method of closing the opening according to the example of the present invention.

Subsequently, as shown in FIG. 44, the seed layer 29B is allowed to grow by a selective growth method so that the openings 21 provided to the film 19 are closed.

The MEMS component shown in FIG. 36 is brought to completion by the above-described steps.

According to such a method, since an excessive deposit is not stored in the cavity when closing the openings 20 and 21, a high process yield can be realized.

b. Second Example

Figure 45:
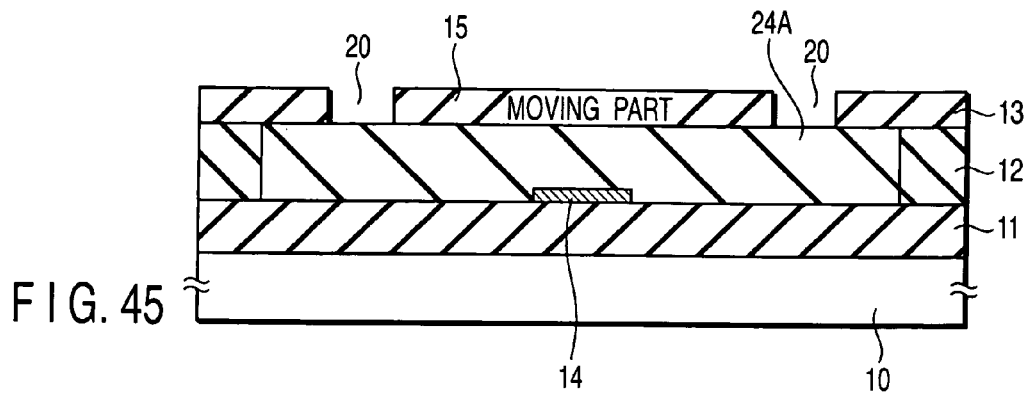
FIG. 45 is a cross-sectional view showing a step in the method of closing the opening according to the example of the present invention.

First, as shown in FIG. 45, an insulating layer (e.g., silicon oxide) 11 is formed on a semiconductor substrate 10 by using a thermal oxidation method. Additionally, an insulating layer (e.g., silicon oxide) 12 is formed on the insulating layer 11 by using a CVD method.

Further, a groove is formed to the insulating layer 12 by a PEP. An electroconductive layer 14 is formed on the insulating layers 11 and 12, and the electroconductive layer 14 is patterned by the PEP, thereby obtaining a lower electrode.

Subsequently, a dummy layer 24A which completely fills the groove formed to the insulating layer 12 is formed. As the dummy layer 24A, it is possible to select and use one from a group consisting of a silicon material such as polysilicon or amorphous silicon, an insulating material such as $SiO_2$ or SiN, a metal material such as Ti, TiN, Al, Cu, Ni, Co or Au, an organic material such as polyimide, carbon or resist, and a so-called low-k material having a low dielectric constant.

Then, insulating layers (e.g., silicon oxide) 13 and 15 are formed on the insulating layer 12 and the dummy layer 24A by using the CVD method. Here, since a surface of the dummy layer 24A is flattened, surfaces of the insulating layers 13 and 15 are also flat.

Furthermore, openings 20 are formed to the insulating layers 13 and 15 by using a PEP, and an actuator comprising, e.g., a piezoelectric element is formed on the insulating layer 15.

Figure 46:
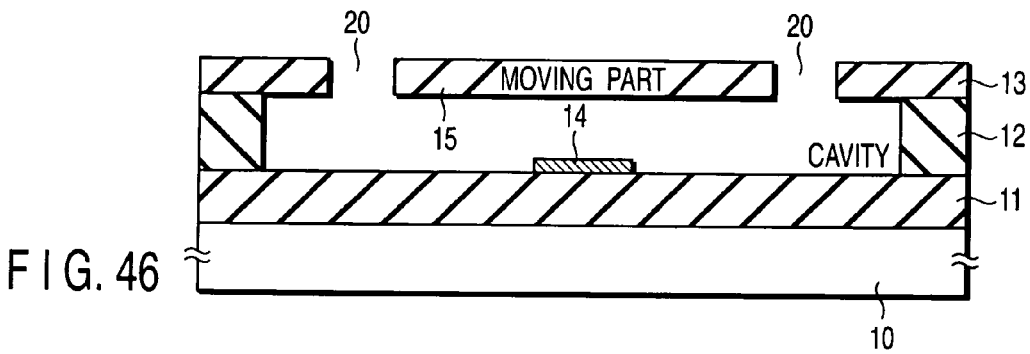
FIG. 46 is a cross-sectional view showing a step in the method of closing the opening according to the example of the present invention.

Then, as shown in FIG. 46, when the dummy layer 24A depicted in FIG. 45 is removed by using a reactive gas or a chemical, a cavity is formed.

Here, when the dummy layer 24A is formed of resist like the first example, the dummy layer 24A can be removed by a vaporizing method called ashing which uses an oxygen gas.

Figure 47:
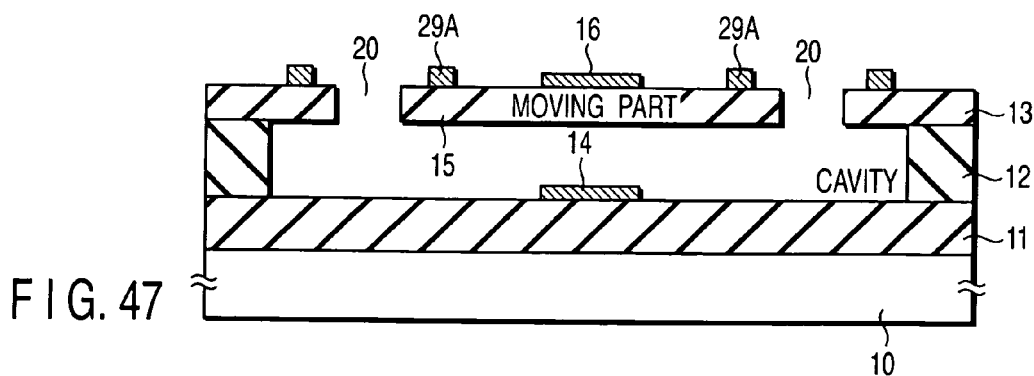
FIG. 47 is a cross-sectional view showing a step in the method of closing the opening according to the example of the present invention.

Subsequently, as shown in FIG. 47, an electroconductive layer 16 is formed on the insulating layer 15 as a moving part, and the electroconductive layer 16 is patterned by the PEP, thereby obtaining an upper electrode.

Moreover, a seed layer 29A which serves as a seed of selective growth is formed around each opening 20. The seed layer 29A may be partially provided around the opening 20, or may be annularly formed to surround the opening 20. Additionally, the seed layer 29A may be linearly formed along one side of the opening 20.

The seed layer 29A is formed of a material such as Si or SiGe.

It is to be noted that the order of forming the upper electrode 16 and the seed layer 29A can be appropriately reversed.

Figure 48:
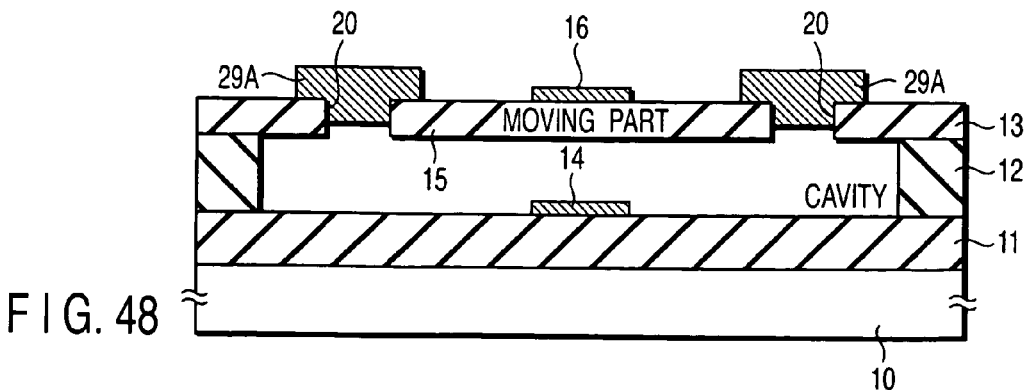
FIG. 48 is a cross-sectional view showing a step in the method of closing the opening according to the example of the present invention.

Then, as shown in FIG. 48, the seed layer 29A is allowed to grow by a selective growth method so that the openings 20 provided to the insulating layers 13 and 15 are closed.

Figure 49:
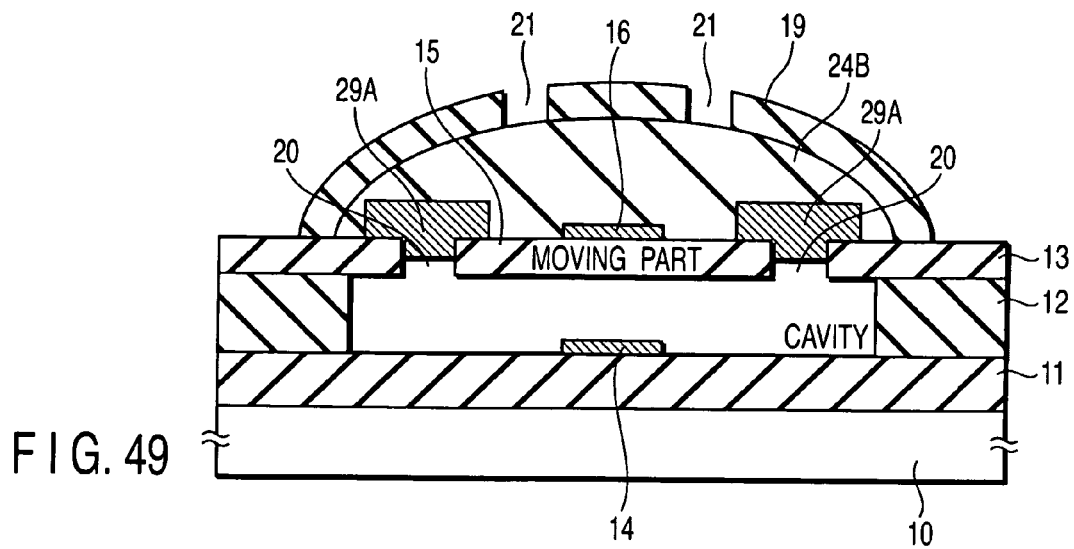
FIG. 49 is a cross-sectional view showing a step in the method of closing the opening according to the example of the present invention.

Subsequently, as shown in FIG. 49, a dummy layer 24B which covers the insulating layer 15 and the seed layer 29A is formed. The dummy layer 24B is formed of, e.g., the same material as that of the dummy layer 24B depicted in FIG. 45.

As the dummy layer 24B, it is possible to select and use one from a group consisting of a silicon material such as polysilicon or amorphous silicon, an insulating material such as $SiO_2$ or SiN, a metal material such as Ti, TiN, Al, Cu, Ni, Co or Au, an organic material such as polyimide, carbon or resist, and a so-called low-k material having a low dielectric constant.

A cross-sectional shape and a planar shape of the dummy layer 24B are square when the dummy layer 24B is processed into a shape which covers the insulating layer 15 like the first example.

Thus, like the first example, the dummy layer 24B is fluidized by performing, e.g., annealing so that the dummy layer 24B has a curved surface by the surface tension. At this moment, the dummy layer 24B may still have the square shape, or may have a circular or elliptic shape.

Then, a film (e.g., silicon oxide) 19 constituted of an insulator is formed on the dummy layer 24B. As to the film 19 constituted of the insulator, this film 19 may be formed of a conductor or a semiconductor in place of the insulator.

Further, openings 21 are formed to the film 19 constituted of the insulator by using a PEP. The number of the openings 21 may be a singular number or a plural number. Furthermore, as to a position of each opening 21, the opening 21 is provided at a position where it does not overlap the opening 20 while considering a step of closing each opening 21 which will be performed later.

Figure 50:
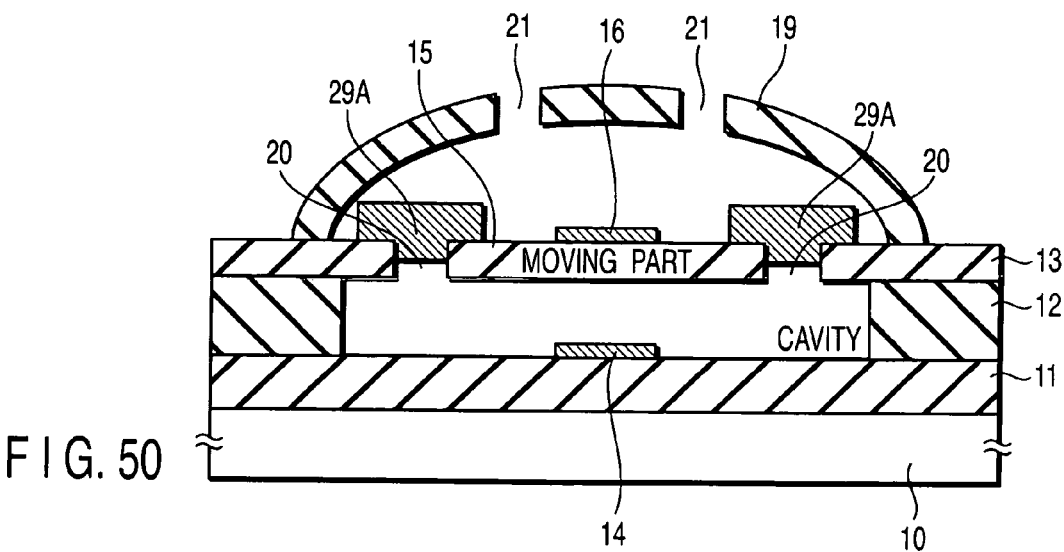
FIG. 50 is a cross-sectional view showing a step in the method of closing the opening according to the example of the present invention.

Subsequently, when the dummy layer 24B depicted in FIG. 49 is removed by using a chemical or a reactive gas as shown in FIG. 50, a cavity is formed around the insulating layer 15 as the moving part.

It is to be noted that, when the dummy layer 24B is formed of resist, the dummy layer 24B can be removed by a vaporizing method called ashing.

The seed layer 29A in the cavity closing each opening 20 is also removed. As a result, the moving part is allowed to move.

Figure 51:
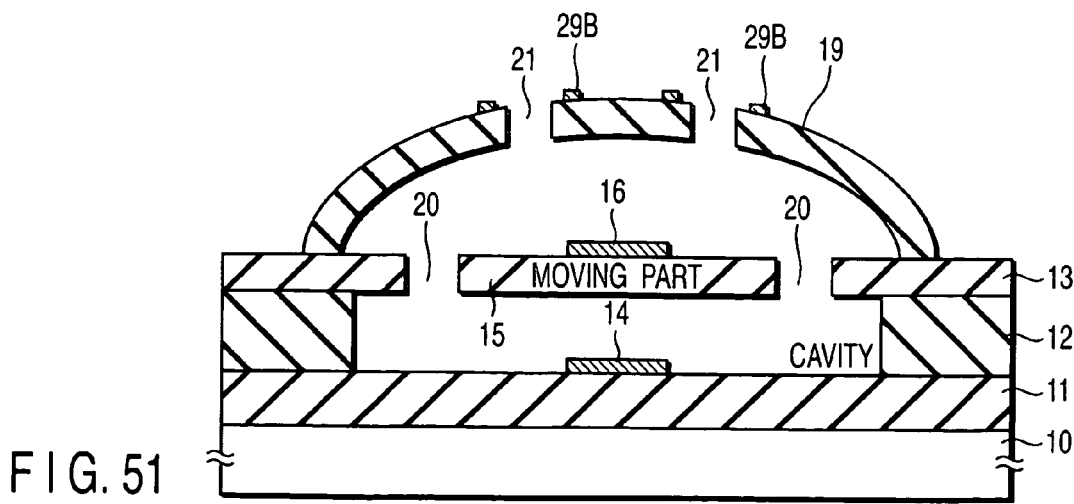
FIG. 51 is a cross-sectional view showing a step in the method of closing the opening according to the example of the present invention.

Then, as shown in FIG. 51, a seed layer 29B which serves as a seed of selective growth is formed around each opening 21. The seed layer 29B may be partially provided around the opening 21, or may be annularly formed to surround the opening 21. Moreover, the seed layer 29B may be linearly formed along one side of the opening 21.

The seed layer 29B is formed of a material such as Si or SiGe.

Figure 52:
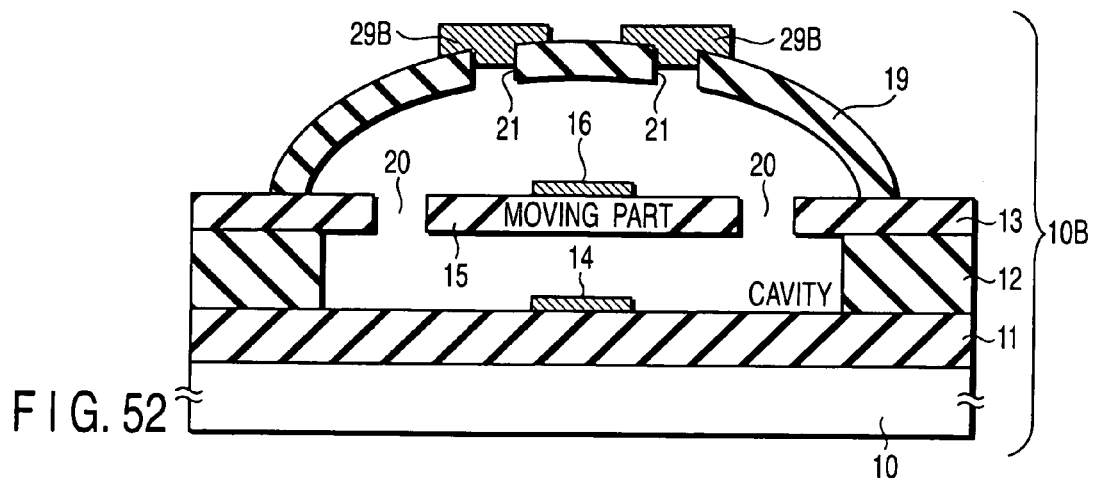
FIG. 52 is a cross-sectional view showing a step in the method of closing the opening according to the example of the present invention.

Subsequently, as shown in FIG. 52, the seed layer 29B is allowed to grow by the selective growth method so that the openings 21 provided to the film 19 are closed.

The MEMS component shown in FIG. 36 is brought to completion by the above-described steps.

Since an excessive deposit is not stored in the cavity by such a method when closing the openings 20 and 21, thereby realizing a high process yield.

6. APPLICATIONS

Applications of the examples according to the present invention will now be described.

(1) Piezoelectric Type Variable Capacity a. Configuration

Figure 53:
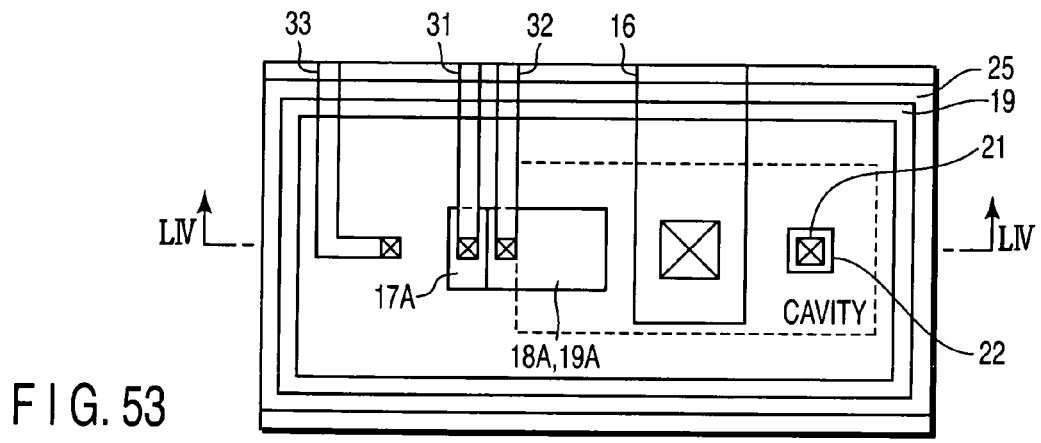
FIG. 53 is a plan view showing a variable capacity as an application of the present invention.
Figure 54:
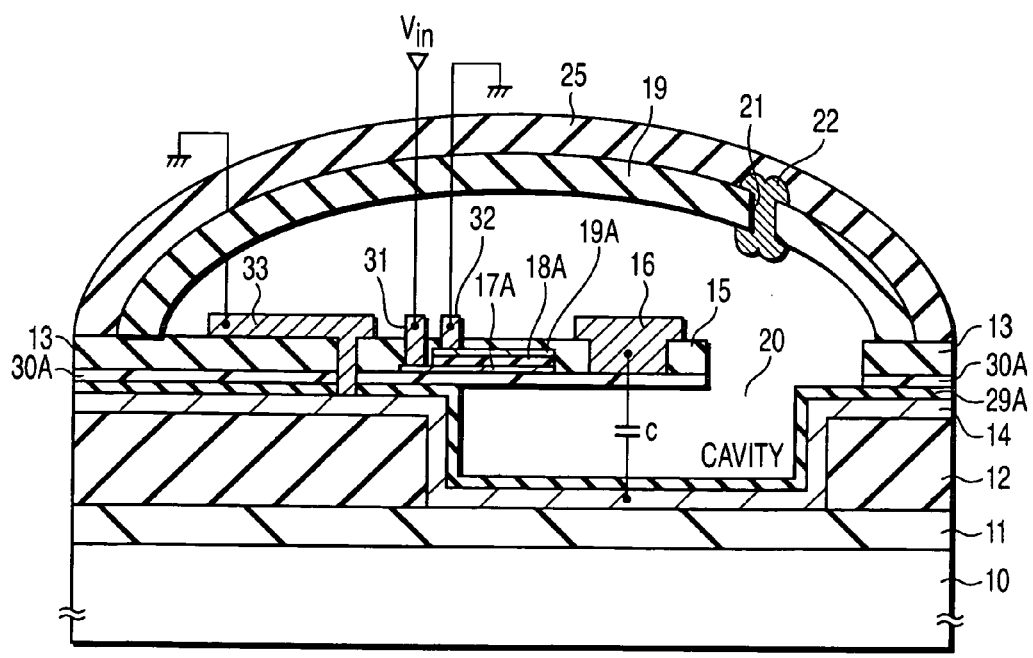
FIG. 54 is a cross-sectional view taken along a line LIV-LIV in FIG. 53.

FIGS. 53 and 54 show a piezoelectric type variable capacity to which the examples according to the present invention are applied.

An insulating layer 11 is formed on a semiconductor substrate 10. An insulating layer 12 having a groove is formed on the insulating layer 11. A lower electrode 14 is formed above the insulating layer 11 and in the groove formed to the insulating layer 12. The lower electrode 14 is covered with an insulating layer 29A.

An insulating layer 30A which covers the upper portion of the groove is formed on the insulating layer 29A. An opening 20 is formed to the insulating layer 30A.

A piezoelectric element as an actuator is formed on the insulating layer 30A above the groove. The piezoelectric element comprises, e.g., a first electrode 17A, a piezoelectric layer 18A on the first electrode 17A, and a second electrode 19A on the piezoelectric layer 18A. The first electrode 17A and the second electrode 19A function as, e.g., input terminals for a variable capacity.

An insulating layer 13 which covers the piezoelectric element is formed on the insulating layer 30A. Contact holes which reach the first and second electrodes 17A and 19A are provided to the insulating layer 13, and electroconductive layers 31 and 32 which are connected with the first and second electrodes 17A and 19A through these contact holes are formed on the insulating layer 13.

Additionally, a contact hole which reaches the insulating layer 30A is provided to the insulating layer 13, and an upper electrode 16 which fills this contact hole is formed on the insulating layer 13. The upper electrode 16 serves as, e.g., an output terminal for the variable capacity.

Further, a contact hole which reaches the lower electrode 14 is provided to the insulating layers 13, 29A and 30A, and an electroconductive layer 33 which is connected with the lower electrode 14 through this contact hole is formed on the insulating layer 13.

A film 19 which is constituted of, e.g., an insulator, completely covers the moving part and forms a cavity around the moving part is formed above the insulating layer 13. This film 19 has a curved surface. Furthermore, an opening 21 is provided to this film, and the opening 21 is closed by a material 22 formed of, e.g., an insulator, a conductor or a semiconductor.

Moreover, an insulating film 25 is superposed on the film 19 which covers the moving part. It is preferable for the insulating film 25 to be formed of a material having the density higher than that of the film 19.

Here, for example, when the electroconductive layers 32 and 33 are fixed to a ground potential and an input signal Vin is supplied to the electroconductive layer 31, the piezoelectric element transforms in accordance with the input signal Vin, and a distance between the lower electrode 14 and the upper electrode 16 varies. That is, since a capacitance C between the lower electrode 14 and the upper electrode 16 varies in accordance with the input signal Vin, a piezoelectric type variable capacity can be realized.

b. Material, Size and Others

Since the description has been already given in conjunction with the first to third embodiments, examples of a material, a size and others of the piezoelectric element will be explained here.

As the piezoelectric layer 18A of the piezoelectric element, it is possible to select one from ceramic such as PZT (Pb(Zr, Ti)O$_3$), AlN, ZnO, PbTiO or BTO(BaTiO$_3$), a polymeric material such as PVDF (vinylidene polyfluoride) and others.

As the first and second electrodes 17A and 19A of the piezoelectric element, they can be formed of, e.g., the following materials.

A metal such as Pt, Sr, Ru, Cr, Mo, W, Ti, Ta, Al, Cu or Ni, or an alloy including at least one of these metals.

A nitride, an oxide (e.g., SrRuO) or an alloy of the above-mentioned a.

A laminated layer of a plurality of materials selected from the above-described a. and b.

The first and second electrodes 17A and 19A may be formed of the same configuration or the same material, or may be formed of different configurations or a different materials.

A thickness of the piezoelectric layer is set to be as small as possible, e.g., 0.2 nm or below. A planar shape of the piezoelectric element is not restricted in particular. For example, it is possible to adopt a square shape, a rectangular shape, a circular shape, a polygonal shape and others.

Each of the insulating layers 29A and 30A is formed of an insulator such as silicon nitride, silicon oxide or the like.

A thickness of the insulating layer 12 determines a size of the cavity, i.e., a movable range of the moving part. The thickness of the insulating layer 12 is set to, e.g., 600 nm or above.

The electroconductive layers 31, 32 and 33 have, e.g., the same configuration as that of the upper electrode 16, and formed of the same material as that of the upper electrode 16.

c. Operation

An operation of the variable capacity shown in FIGS. 53 and 54 will now be described.

When operating this variable capacity, it is preferable for the semiconductor substrate 11 to be fixed to, e.g., a ground potential.

In an initial state where no voltage is applied to the piezoelectric element as the moving part, i.e., when the input signal Vin is 0 V, since a voltage is not applied to the piezoelectric element, a distance between the lower electrode 14 and the upper electrode 16 is the largest distance. A capacitance C at this moment is determined as Cmin.

When the input signal Vin is increased to a value of, e.g., 0 V or above, a transformation quantity of the piezoelectric element is increased in accordance with this value, and the distance between the lower electrode 14 and the upper electrode 16 is gradually reduced. Since the capacitance C between the lower electrode 14 and the upper electrode 16 is in inverse proportion to the distance between the both members, the capacitance C is also gradually increased in accordance with an increase of the input signal Vin.

Assuming that the capacitance Cmin when the input signal Vin is 0 V is approximately 0.08 pF, a capacitance Cmax when the input signal Vin is set to 3 V (the maximum value) is approximately 13 pF. However, it is assumed that the upper electrode 16 has a circular shape with a diameter of 100 μm and the distance between the lower electrode 14 and the upper electrode 16 in the initial state is 1 μm.

Incidentally, it is preferable to set the maximum value of the input signal Vin to 3 V or below in order to reduce a voltage, and it is also preferable for a capacitance ratio (Cmax/Cmin) at this moment is 20 or above under the operating condition of −45° C. to 125° C.

d. Manufacturing Method

A manufacturing method of the variable capacity shown in FIGS. 53 and 54 will now be described.

Figure 55:
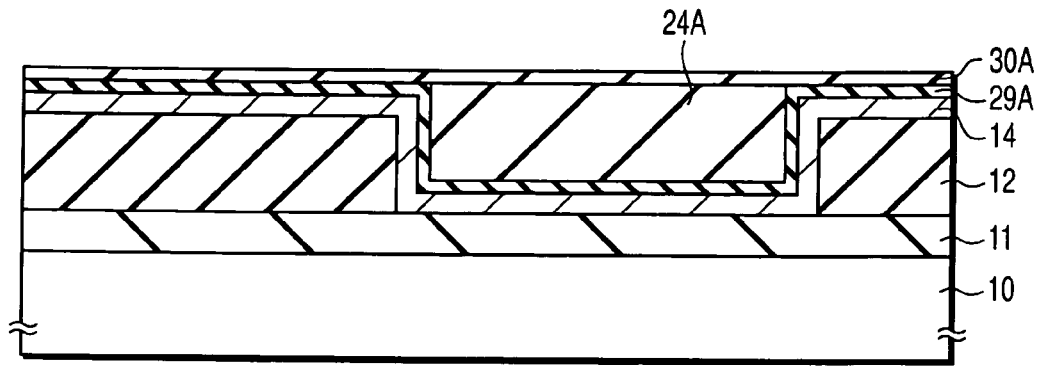
FIG. 55 is a cross-sectional view showing a step in a method of manufacturing the variable capacity depicted in FIGS. 53 and 54.

First, as shown in FIG. 55, an insulating layer (e.g., silicon oxide) 11 having a thickness of approximately 1.3 μm is formed on a semiconductor substrate 10 by using a thermal oxidation method. Further, an insulating layer (e.g., silicon oxide) 12 having a thickness of approximately 1 μm is formed on the insulating layer 11 by using a CVD method.

Then, a groove 12 is formed to the insulating layer 12 by a PEP. That is, a resist pattern is formed on the insulating layer 12, and the insulating layer 12 is etched by RIE with this resist pattern being used as a mask. Thereafter, the resist pattern is removed.

Subsequently, an electroconductive layer 14 is formed on the insulating layer 12 and in the groove, and the electroconductive layer 14 is patterned by the PEP, thereby obtaining a lower electrode. Furthermore, an insulating layer (e.g., silicon nitride) 29A which has a thickness of approximately 50 nm and covers the lower electrode 14 is formed by the CVD method.

Moreover, a dummy layer (e.g., polysilicon) 24A which completely fills the groove is formed on the insulating layer 29A by using the CVD method. Thereafter, the dummy layer 24A is polished by the CMP, the dummy layer 24A is left in the groove only, and the surface of the dummy layer 24A is flattened.

Additionally, an insulating layer (e.g., silicon nitride) 30A having a thickness of approximately 50 nm is formed on the insulating layer 29A and the dummy layer 24A by using the CVD method. Here, since the surface of the dummy layer 24A is flattened, the surface of the insulating layer 30A is also flat.

Figure 56:
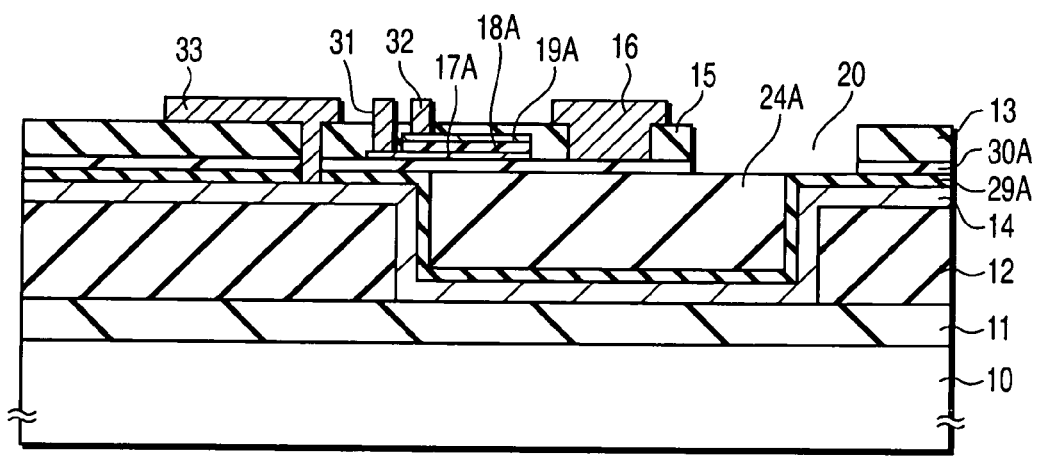
FIG. 56 is a cross-sectional view showing a step in the method of manufacturing the variable capacity depicted in FIGS. 53 and 54.

Then, as shown in FIG. 56, a piezoelectric element as an actuator is formed on the insulating layer 30A. The piezoelectric element is formed by sequentially depositing, e.g., a first electrode 17A, a piezoelectric layer 18A and a second electrode 19A and patterning these members.

It is to be noted that irregularities in characteristics of the piezoelectric element can be reduced when the piezoelectric element is formed on the flat insulating layer 30A, and hence the piezoelectric element can contribute to an improvement in the reliability of the variable capacity as the MEMS component.

Then, insulating layers (e.g., silicon oxide) 13 and 15 which completely cover the piezoelectric element and have a thickness of approximately 100 nm are formed on the insulating layer 30A by using the CVD method.

Further, a contact hole which reaches the first electrode 17A of the piezoelectric element, a contact hole which reaches the second electrode 19A of the piezoelectric element and a contact hole which reaches the insulating layer 30A are respectively formed to the insulating layers 13 and 15. Furthermore, a contact hole which reaches the lower electrode 14 on the insulating layer 12 is formed to the insulating layers 13, 15, 19A and 30A. These contact holes are simultaneously formed by the PEP and the RIE for one time.

Moreover, a hole 20 which is used to form a cavity is formed to the insulating layers 13, 15 and 30A. This hole 20 can be also simultaneously formed with the contact holes including the contact holes reaching the first and second electrodes 17A and 19A, for example.

The hole 20 may be provided at, e.g., one position at a end portion of the groove, or a plurality of positions. A shape of the hole 20 is not restricted in particular, and it is possible to adopt a circular shape, an elliptic shape, a square shape, a polygonal shape and others.

Figure 57:
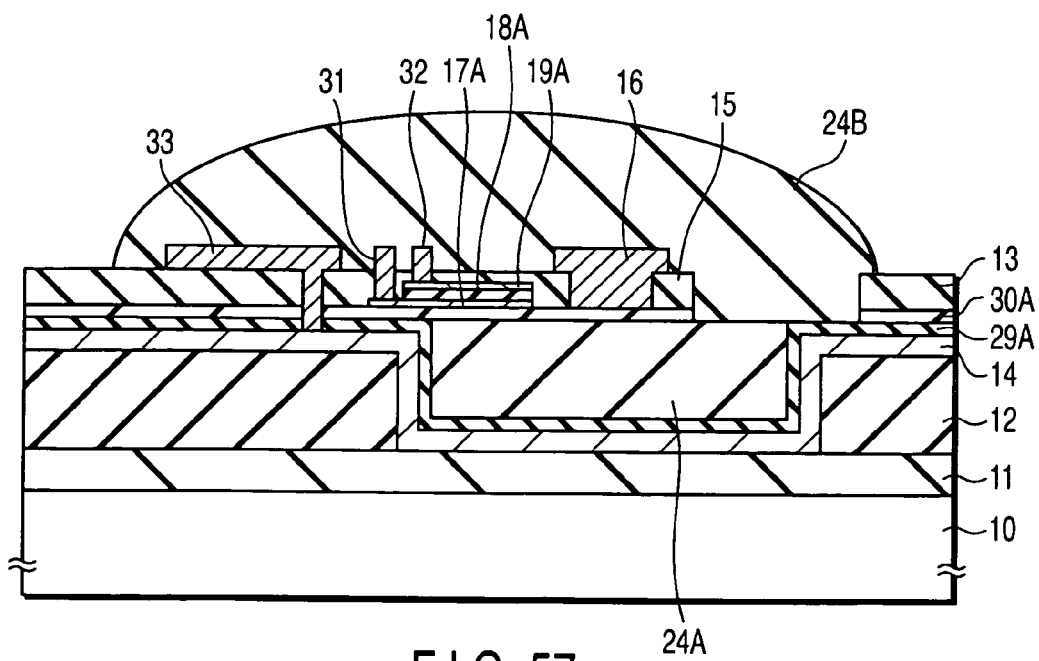
FIG. 57 is a cross-sectional view showing a step in the method of manufacturing the variable capacity depicted in FIGS. 53 and 54.

Then, as shown in FIG. 57, a dummy layer 24B which covers the moving part is formed. When the dummy layer 24A is not removed at the step shown in FIG. 56, it is preferable for the dummy layer 24B to be formed of the same material as that of the dummy layer 24A or a material which can be removed by using the same etchant as that of the dummy layer 24A.

When the dummy layer 24A is removed at the step depicted in FIG. 56, the dummy layer 24B is also filled in the groove of the insulating layer 12 in place of the dummy layer 24A.

As the dummy layer 24B, it is possible to select and use one from a group consisting of a silicon material such as polysilicon or amorphous silicon, an insulating material such as $SiO_2$ or SiN, a metal material such as Ti, TiN, Al, Cu, Ni, Co or Au, an organic material such as polyimide, carbon or resist, and a so-called low-k material having a low dielectric constant like the dummy layer 24A.

A cross-sectional shape and a planar shape of the dummy layer 24B are square when the dummy layer 24B is processed into a shape which covers the moving part.

In this example, the dummy layer 24B is then fluidized by performing, e.g., annealing so that the dummy layer 24B has a curved surface by the surface tension. At this moment, the dummy layer 24B may still have the square planar shape, or may have a circular or elliptic shape.

Figure 58:
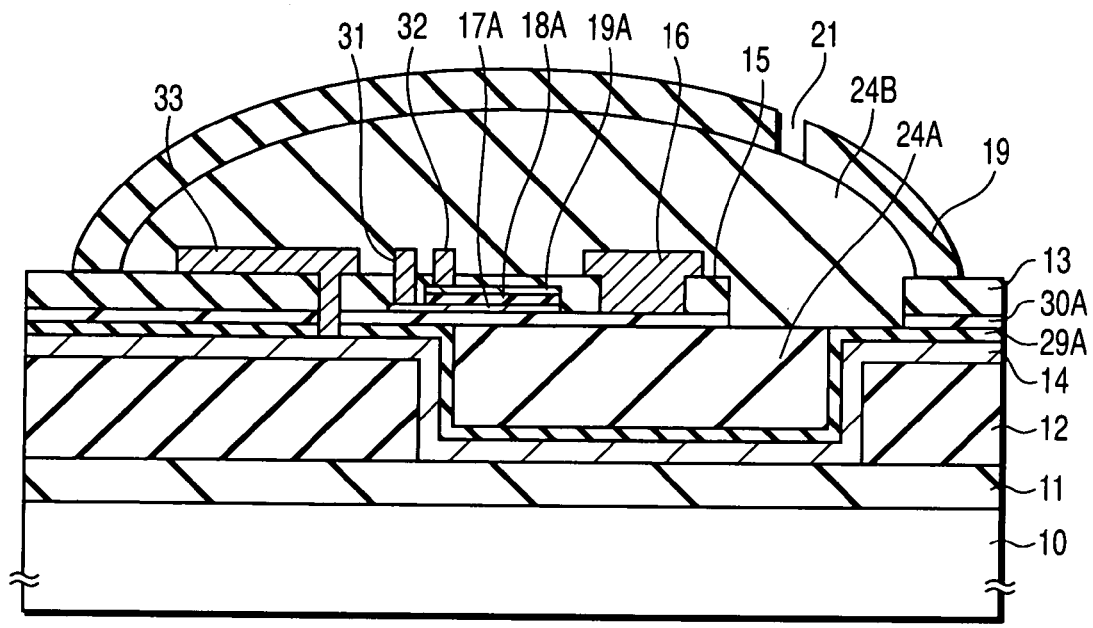
FIG. 58 is a cross-sectional view showing a step in the method of manufacturing the variable capacity depicted in FIGS. 53 and 54.

Then, as shown in FIG. 58, a film (e.g., silicon oxide) 19 constituted of an insulator is formed on the dummy layer 24B. As to the film 19 constituted of the insulator, this film 19 may be formed of a conductor or a semiconductor in place of the insulator.

Additionally, an opening 21 is formed to the film 19 constituted of the insulator by using the PEP. The number of the opening 21 may be a singular number or a plural number. Further, as to a position of the opening 21, the opening 21 is provided at a position which is apart from the moving part as much as possible while considering a step of closing the opening 21 which will be performed later.

Figure 59:
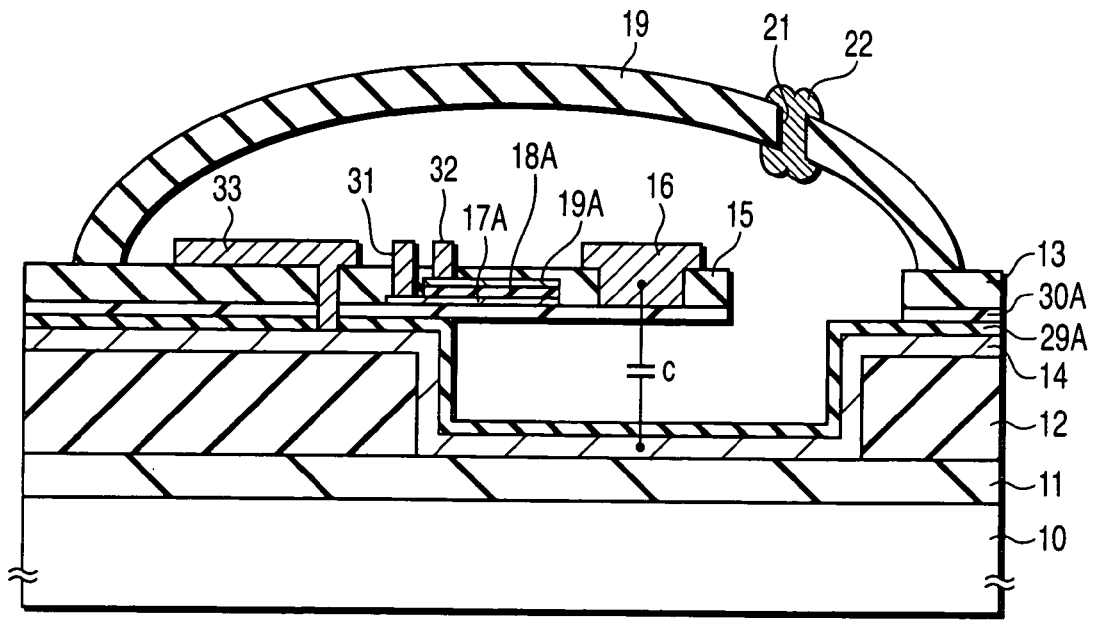
FIG. 59 is a cross-sectional view showing a step in the method of manufacturing the variable capacity depicted in FIGS. 53 and 54.

Thereafter, when the dummy layers 24A and 24B are removed by using a chemical or a reactive gas, a cavity is formed around the moving part as shown in FIG. 59.

It is to be noted that, when the dummy layers 24A and 24B are formed of resist, the dummy layers 24A and 24B can be removed by a vaporizing method called ashing.

Then, as shown in FIG. 59, the opening 21 formed to the film constituted of the insulator is closed by using a material 22 formed of, e.g., an insulator, a conductor or a semiconductor by using a method such as a CVD method or a sputtering method, thereby sealing the cavity.

Additionally, when the material 22 which closes the opening 21 is formed by a method using plasma, e.g., plasma CVD, a seam may be formed is some cases. In such a case, since water may possibly enter from the seam, an insulating film (e.g., silicon oxide) 25 is formed on the film 19 constituted of the insulator by the CVD method as shown in FIG. 60, for example.

The insulating film 25 may be formed of the same material as that of the film 19 constituted of the insulator, or may be formed of a different material. Further, it is preferable for the insulating film 25 to be formed of a material having the density higher than that of the film 19 constituted of the insulator.

It is to be noted that the insulating film 25 is not restricted to the insulator, and a conductor or a semiconductor may be used.

The variable capacity shown in FIGS. 53 and 54 is brought to completion by the above-described steps.

e. Summary

As described above, an improvement in the reliability and a process yield and a reduction in a manufacturing cost of the variable capacity as a MEMS component can be simultaneously realized by applying the examples according to the present invention to the variable capacity.

(2) Others

By applying the examples according to the present invention to general MEMS components, e.g., a switch, an acceleration sensor, a pressure sensor, an RF filter, a gyroscope, a mirror device as well as the above-described variable capacity, an improvement in performances and a reduction in a manufacturing cost of these MEMS components can be simultaneously realized.

Further, the examples according to the present invention can be applied to a discrete product in which a MEMS component alone is formed within one chip as well as a system LSI in which a MEMS component and an LSI (a logic circuit, a memory circuit or the like) are both mounted within one chip, thereby realizing an increase in performances and a reduction in a packaging dimension of the system LSI.

For example, the examples according to the present invention can be applied as a variable capacity C of such a VCO (voltage controlled oscillator) as shown in FIG. 61 which is used in a portable device such as a mobile phone and a communication device such as a wireless LAN.

Furthermore, as shown in FIGS. 62 and 63, the examples according to the present invention can be applied to the variable capacity C in a matching circuit of a transmitter/receiver. Moreover, when each part surrounded by a broken line is realized as one chip, the high performance and a reduction in packaging dimension of the system LSI can be achieved.

Additionally, as shown in FIG. 64, the examples of the present invention can be also applied to the variable capacity C in a filter.

7. OTHERS

According to the examples of the present invention, it is possible to realize the MEMS component which can achieve the high reliability, a high process yield and a reduction in a manufacturing cost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device using a MEMS technology, the semiconductor device comprising:
   a cavity;
   a lower electrode positioned below the cavity;
   a moving part positioned in the cavity;
   an upper electrode coupled with the moving part;
   a first film which covers an upper portion of the cavity and has a first opening;

a material which closes the first opening and seals the cavity; and a member positioned in the cavity and in substantially a same vertical level as the moving part and below the first film, wherein a second opening is provided between the member and the moving part and is configured to allow movement of the moving part as seen from above the cavity, and wherein a position of the first opening does not overlap with a position of the second opening.

2. The semiconductor device according to claim 1, wherein the first opening and the second opening are at different vertical levels.

3. The semiconductor device according to claim 1, wherein the first and second openings are 0.3 μm or more away from each other as seen from above the cavity.

4. The semiconductor device according to claim 1, further comprising a second film which covers the first film.

5. The semiconductor device according to claim 1, wherein the material is one selected from a semiconductor including Si or SiGe, an insulator, or a conductor.

6. The semiconductor device according to claim 1, wherein a surface of the first film is a curved surface.

7. The semiconductor device according to claim 1, further comprising a column positioned inside the cavity and configured to support the first film.

8. A piezoelectric type variable capacitor comprising:
the semiconductor device according to claim 1; and
a piezoelectric element configured as an actuator and coupled with the moving part.

9. A semiconductor device using a MEMS technology, the semiconductor device comprising:
a cavity;
a lower electrode positioned below the cavity;
a moving part positioned in the cavity;
an upper electrode coupled with the moving part;
a first film which covers an upper portion of the cavity and has a first opening;
a plurality of columns positioned inside the cavity and configured to support the first film, wherein the plurality of columns are arranged at a pitch not greater than 500 μm; and
a member positioned in the cavity and in substantially a same vertical level as the moving part and below the first film,
wherein a second opening is provided between the member and the moving part and is configured to allow movement of the moving part as seen from above the cavity, and
wherein a position of the first opening does not overlap with a position of the second opening.

10. The semiconductor device according to claim 9, wherein each of the plurality of columns is a prismatic column or a cylindrical column, and wherein a length of one side of each column or a diameter of the same is not greater than 40 μm.

11. The semiconductor device according to claim 9, further comprising a second film which covers the first film.

12. A piezoelectric type variable capacitor comprising:
the semiconductor device according to claim 9; and
a piezoelectric element configured as an actuator and coupled with the moving part.

13. The semiconductor device of claim 1, wherein the first film comprises a porous material.

14. The semiconductor device of claim 4, wherein the second film has a density higher than the first film.

15. A semiconductor device, comprising:
a cavity;
a first film covering an upper portion of the cavity, wherein the first film has a first opening, and wherein the first opening is filled with a sealing material;
a moving part enclosed in the cavity;
a member enclosed in the cavity and in substantially a same vertical level as the moving part, wherein the member and the moving part form a second opening therebetween;
an actuator configured to drive the moving part in a substantially horizontal direction;
wherein the first and second openings are at different horizontal positions and different vertical levels.

16. The semiconductor device of claim 15, wherein the first film comprises a porous material.

17. The semiconductor device of claim 15, further comprising a second film substantially covering the first film, wherein the second film has a density higher than the first film.

18. The semiconductor device of claim 15, wherein a surface of the first film is a curved surface.

19. The semiconductor device of claim 15, further comprising a column positioned inside the cavity and configured to support the first film.

20. A variable capacitor, comprising:
a cavity;
a first film covering an upper portion of the cavity, wherein the first film has a first opening, and wherein the first opening is filled with a sealing material;
a moving part enclosed in the cavity;
a member enclosed in the cavity and in substantially a same vertical level as the moving part, wherein a second opening is provided between the member and the moving part;
an actuator comprising a piezoelectric element and configured to drive the moving part in a substantially horizontal direction;
wherein the first and second openings are at different horizontal positions and different vertical levels.

* * * * *